United States Patent
Sato et al.

(10) Patent No.: US 7,981,700 B2
(45) Date of Patent: Jul. 19, 2011

(54) SEMICONDUCTOR OXIDATION APPARATUS AND METHOD OF PRODUCING SEMICONDUCTOR ELEMENT

(75) Inventors: Shunichi Sato, Miyagi (JP); Naoto Jikutani, Miyagi (JP); Akihiro Itoh, Miyagi (JP); Shinya Umemoto, Kyoto (JP); Yoshiaki Zenno, Kyoto (JP); Takatoshi Yamamoto, Kyoto (JP)

(73) Assignee: Ricoh Company, Ltd., Tokyo (JP)

( * ) Notice: Subject to any disclaimer, the term of this patent is extended or adjusted under 35 U.S.C. 154(b) by 1308 days.

(21) Appl. No.: 10/592,213

(22) PCT Filed: Feb. 13, 2006

(86) PCT No.: PCT/JP2006/302898
§ 371 (c)(1),
(2), (4) Date: Sep. 7, 2006

(87) PCT Pub. No.: WO2006/088166
PCT Pub. Date: Aug. 24, 2006

(65) Prior Publication Data
US 2008/0233017 A1 Sep. 25, 2008

(30) Foreign Application Priority Data
Feb. 15, 2005 (JP) .................. 2005-037805

(51) Int. Cl.
*H01L 21/00* (2006.01)
*G01R 31/26* (2006.01)
*H01L 21/76* (2006.01)

(52) U.S. Cl. ........... 438/5; 438/6; 438/7; 438/8; 438/9; 438/10; 438/11; 438/12; 438/13; 438/14; 438/16; 438/17; 438/18; 438/400; 438/432

(58) Field of Classification Search .................. None
See application file for complete search history.

(56) References Cited

U.S. PATENT DOCUMENTS

| 5,493,577 A | 2/1996 | Choquette et al. |
| 6,495,381 B2 | 12/2002 | Song et al. |

FOREIGN PATENT DOCUMENTS

| JP | 8-227881 | 9/1996 |
| JP | 2001-332813 | 11/2001 |
| JP | 2002-343792 | 11/2002 |
| JP | 2003-179309 | 6/2003 |

(Continued)

OTHER PUBLICATIONS

Oct. 31, 2007 Korean official action (and English translation thereof) in connection with corresponding Korean application No. 10-2006-7021340.

(Continued)

*Primary Examiner* — Jill Warden
*Assistant Examiner* — Neil Turk
(74) *Attorney, Agent, or Firm* — Cooper & Dunham LLP

(57) ABSTRACT

A semiconductor oxidation apparatus is provided with a sealable oxidation chamber defined by walls, a base provided within the oxidation chamber and configured to support a semiconductor sample, a supply part configured to supply water vapor into the oxidation chamber to oxidize a specific portion of the semiconductor sample, a monitoring window provided in one of the walls of the oxidation chamber and disposed at a position capable of confronting the semiconductor sample supported on the base, a monitoring part provided outside the oxidation chamber and capable of confronting the semiconductor sample supported on the base via the monitoring window, and an adjusting part configured to adjust a distance between the base and the monitoring part.

7 Claims, 16 Drawing Sheets

FOREIGN PATENT DOCUMENTS

| | | |
|---|---|---|
| JP | 2004-22686 | 1/2004 |
| JP | 2004-289169 | 10/2004 |
| KR | 2001105786 | 11/2001 |
| KR | 2002095832 | 12/2002 |

OTHER PUBLICATIONS

Zenno, et al. "Development of New Oxidation Apparatus for Manufacturing Surface-Emitting Lasers", Optical Alliance, pp. 42-46, Apr. 2004 (including partial English translation of Development of Improved Proto Apparatus).

Choquette, et al., "Advances in Selective Wet Oxidation of AlGaAs Alloys", IEEE Journal of Selected Topics in Quantum Electronics, vol. 3, No. 3, Jun. 1997, pp. 916-925.

Feld, et al., "*In Situ* Optical Monitoring of AlAs Wet Oxidation Using a Novel Low-Temperature Low-Pressure Steam Furnace Design", IEEE Photonics Technology Letters, vol. 10, No. 2, Feb. 1998, pp. 197-198.

Oct. 18, 2010 European search report in connection with counterpart European patent application No. 06714039.

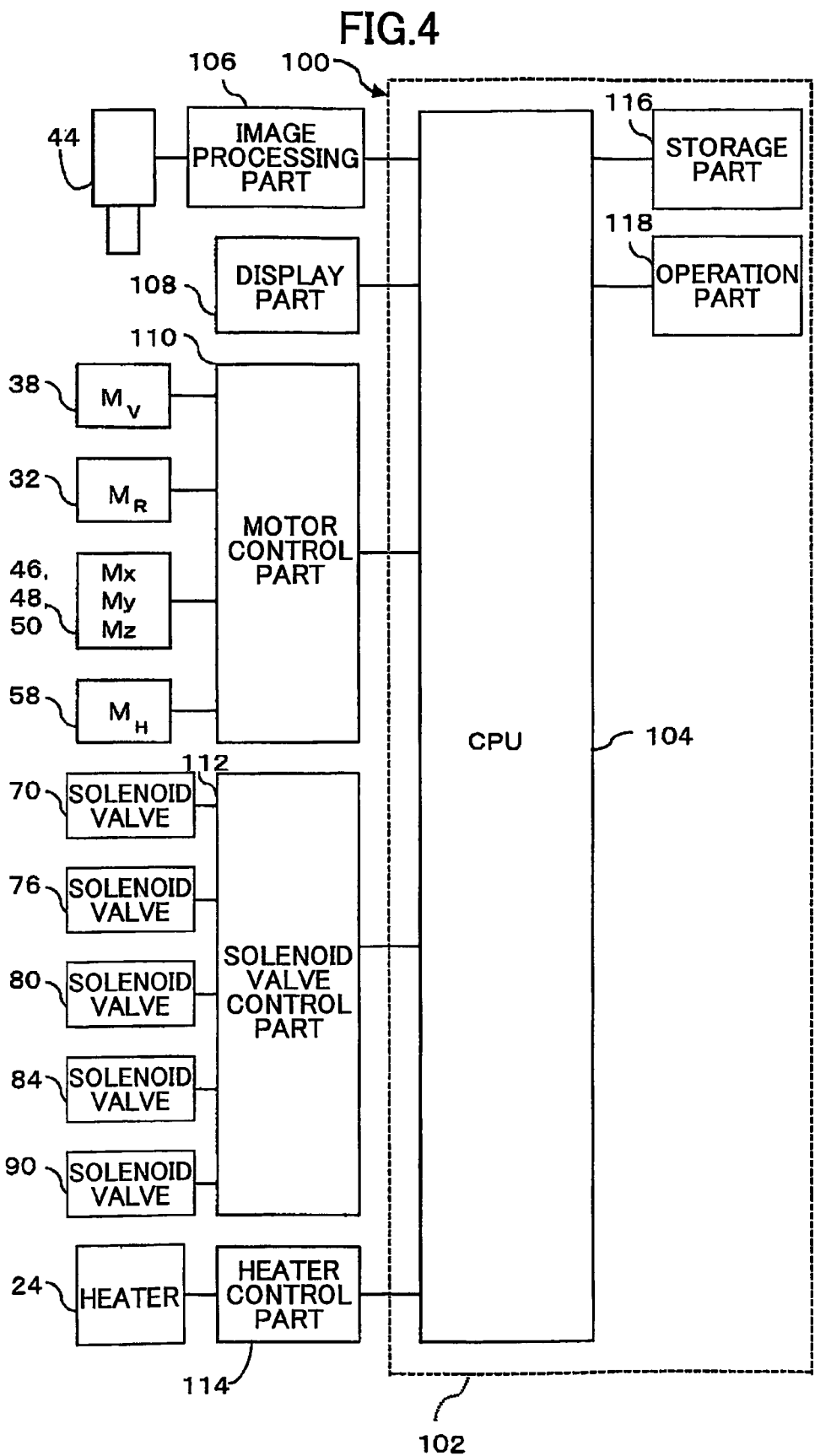

LASER LIGHT

US 7,981,700 B2

SEMICONDUCTOR OXIDATION APPARATUS AND METHOD OF PRODUCING SEMICONDUCTOR ELEMENT

TECHNICAL FIELD

This disclosure generally relates to semiconductor oxidation apparatuses and methods of producing semiconductor element, and more particularly to a semiconductor oxidation apparatus and a method of producing semiconductor element, which oxidize a semiconductor element including aluminum (Al) and arsenide (As) from an outer peripheral edge portion towards a central portion, and are particularly suited for producing an oxidized constricting type surface-emitting laser in which sizes of a current constricting part and a current injecting part are appropriately adjusted.

BACKGROUND ART

There are semiconductor lasers having a current constricting structure in order to improve the current flow efficiency. A vertical-cavity surface-emitting laser (VCSEL) is an example of such a semiconductor laser. The VCSEL emits light in a direction perpendicular to a substrate, and compared to the so-called edge-emitting semiconductor lasers, the VCSEL has low cost, low power consumption, small size, high performance and is suited for application to two-dimensional devices. For this reason, much attention is recently drawn to the VCSEL.

An AlAs selective oxidation constricting structure is popularly used for the current constricting structure of the VCSEL, as may be seen from a U.S. Pat. No. 5,493,577, for example. This current constricting structure of the VCSEL is formed by placing a semiconductor substrate or a semiconductor sample including a circular or rectangular base shaped mesa structure within a high-temperature steam atmosphere, and oxidizing a p-AlAs selective oxidized layer included in the mesa structure from an outer peripheral edge that is exposed at a side surface of the mesa structure towards a central portion in a state leaving the central portion non-oxidized so as to form an $Al_xO_y$ current constricting part (oxidized region). In the VCSEL having the $Al_xO_y$ current constricting part that is formed in the above described manner, the index of refraction of the $Al_xO_y$ current constricting part is approximately 1.6, and is low compared to indexes of refraction of other semiconductor layers. For this reason, a difference is introduced between the indexes of refraction in a lateral direction within a resonant structure, and it is possible to trap the light at the center of the mesa structure. Thus, desirable characteristics are obtained in that the current constricting efficiency of the semiconductor element is good and the threshold current is low.

In order to obtain the single basic lateral mode oscillation in the VCSEL, it is necessary to make the size (for example, the diameter) of the current constricting part must be made small and the diffraction loss with respect to the high order mode must be made large. More particularly, the size of one side or the diameter of the current constricting part must be made narrow to approximately 3 to approximately 4 times the oscillation wavelength. For example, if the oscillation wavelength is 0.85 μm or 1.3 μm, the size of one side or the diameter of the current constricting part must be approximately 3.5 μm or less or approximately 5.0 μm or less, respectively.

A semiconductor oxidation apparatus satisfying such needs is proposed in Zenno et al., "Development of New Oxidation Apparatus For Manufacturing Surface-Emitting Lasers", Optical Alliance, pp. 42-46, April 2004. FIG. 1 shows a general structure of this proposed semiconductor oxidation apparatus. A semiconductor oxidation apparatus 1010 shown in FIG. 1 has a sealable container (or oxidation chamber) 1012, and a heating stage 1016 that has a built-in heater is provided in a chamber interior 1014 of this oxidation chamber 1012. A substrate holder 1018 is provided on the heating stage 1016, and a semiconductor sample (or semiconductor substrate) 1020 is placed on the substrate holder 1018. The oxidation chamber 1012 is also provided with an inlet pipe 1022 for supplying an oxidizing atmosphere including vapor into the chamber interior 1014, and an exhaust pipe 1024 for exhausting the oxidizing atmosphere within the chamber interior 1014 after an oxidation process ends. According to the semiconductor oxidation apparatus 1010 having such a structure, it is possible to uniformly oxidize the semiconductor sample 1020 with a relatively good reproducibility. However, the amount of oxidation of the semiconductor sample 1020 is affected by inconsistencies among the lots, such as the composition and the film thickness after the crystal growth in a semiconductor film forming apparatus. Particularly in the case of a semiconductor layer including Al and As, the film thickness and the AlAs composition are extremely sensitive to the oxidation temperature and the like as described in Choquette et al., "Advances in Selective Wet Oxidation of AlGaAs Alloys", IEEE Journal of Selected Topics in Quantum Electronics, Vol. 3, No. 3, pp. 916-926, June 1997, and are also affected by the thickness of a natural oxidation layer that is formed on a side surface of a non-oxidized layer of the semiconductor sample immediately prior to the oxidation process. As a result, the size of the current constricting part causes the inconsistency in the oscillation characteristic such as the optical output, and the yield deteriorates. Particularly in the case of a single-mode element in which the absolute value of the area of the current constricting part is small compared to that of a multi-mode element, the effects of the inconsistency in the amount of oxidation on the inconsistency of the element characteristics are extremely large, and if the area of the current constricting part becomes large the element that should originally behave as a single-mode element may behave like a multi-mode element.

In order to solve the problems described above, methods of monitoring the amount of oxidation during the oxidation process have been proposed in Feld et al., "In Situ Optical Monitoring of AlAs Wet Oxidation Using a Novel Low-Temperature Low-Pressure Steam Furnace Design", IEEE Photonics Technology Letters, Vol. 10, No. 2, pp. 197-199, February 1998 and a Japanese Laid-Open Patent Application No. 2003-179309. According to the proposed methods, a semiconductor sample 1020 during the oxidation process is monitored by a microscope 1028 via a monitoring window 1026 as shown in FIG. 2. The oxidation distance or the area of the non-oxidized region (oxidation rate) is estimated from the contrast between the oxidized region and the non-oxidized region that are monitored by the microscope 1028, and the amount of oxidation is thereafter controlled based on the estimated oxidation distance or the area of the oxidation rate. But normally, the mesa diameter of the VCSEL is approximately 10 μm to approximately 50 μm, and the magnification of the microscope 1028 must be set to approximately 1000 times in order to strictly control the diameter of the current constricting part. In addition, in order to match the focal point of the microscope 1028 on the mesa, a distance L1 between the semiconductor sample 1020 and the monitoring window 1026 and a distance L2 between the monitoring window 1026 and the microscope 1028 must be set short as possible. However, if the distance L1 between the semiconductor sample

1020 and the monitoring window 1026 during the oxidation process is set short, local inconsistencies are generated in the vapor density distribution on the semiconductor sample 1020 and the temperature distribution on the semiconductor sample 1020, to thereby generate an in-plane distribution of the amount of oxidation and cause a deterioration in the yield. On the other hand, if the distance L2 between the monitoring window 1026 and the microscope 1028 is set short, the index of refraction of the monitoring window 1026 may change due to the heat generated from the heater, and the optical elements such as a lens assembled in the microscope 1028 may undergo a thermal deformation and generate a shift in the focal point, to thereby deteriorate the measuring accuracy.

BRIEF SUMMARY

In an aspect of this disclosure, there are provided a semiconductor oxidation apparatus and a method of producing semiconductor element, which can maintain an amount of oxidation of a selectively oxidizing layer included in a semiconductor sample uniform in an in-plane direction, and appropriately control the amount of oxidation.

In another aspect, there is provided a semiconductor oxidation apparatus comprising a sealable oxidation chamber defined by walls; a base provided within the oxidation chamber and configured to support a semiconductor sample; a supply part configured to supply water vapor into the oxidation chamber to oxidize a specific portion of the semiconductor sample; a monitoring window provided in one of the walls of the oxidation chamber and disposed at a position capable of confronting the semiconductor sample supported on the base; a monitoring part provided outside the oxidation chamber and capable of confronting the semiconductor sample supported on the base via the monitoring window; and an adjusting part configured to adjust a distance between the base and the monitoring part. According to the semiconductor oxidation apparatus of the present invention, it is possible to adjust the temperature distribution and the vapor density distribution of the semiconductor sample uniform during the oxidation process, and the oxidation rate of the semiconductor sample can be accurately monitored and evaluated at the time of the monitoring. Hence, it is possible to produce semiconductor elements having uniform characteristics.

In the aforementioned semiconductor oxidation apparatus, the monitoring window may be provided on one of the walls above the semiconductor sample supported on the base, and the adjusting part may include an elevator mechanism that is configured to move at least one of the base and the monitoring part upwards and downwards.

Alternatively, in the aforementioned semiconductor oxidation apparatus, the adjusting part may include a moving mechanism that is configured to move the base between a monitoring position where the semiconductor supported on the base is adjacent to the monitoring window and a receded position where the semiconductor sample supported on the base is separated from the monitoring window by a longer distance that at the monitoring position.

In another aspect of this disclosure, there is provided a method of producing a semiconductor element by placing within a water vapor atmosphere a semiconductor sample that includes a mesa having a semiconductor layer including Al and As, and forming a current constricting part and a current injecting part that is surrounded by the current constricting part in the semiconductor layer by oxidizing the semiconductor layer from a peripheral end of the semiconductor layer appearing at an outer peripheral side surface of the mesa towards an inner radial direction so as to leave a central portion of the semiconductor layer non-oxidized, the method comprising the steps of (a) interrupting an oxidation process at least once during oxidation of the semiconductor layer; and (b) monitoring an oxidation rate of the semiconductor layer while the oxidation process is interrupted. According to the method of the present invention, it is possible to accurately evaluate the oxidation rate at the time when the oxidation process is interrupted, and produce semiconductor elements having uniform characteristics.

The step (b) of the aforementioned method may include (b1) moving the semiconductor sample within an oxidation chamber to a position where the mesa is adjacent to a monitoring part provided outside the oxidation chamber via a monitoring window of the oxidation chamber while the oxidation process is interrupted; and (b2) obtaining the oxidation rate based on a size of the current constricting part or the current injecting part that is monitored by the monitoring part. In this case, it is possible to obtain an extremely accurate oxidation rate.

The aforementioned method may further comprise the steps of (c) obtaining an amount of additional oxidation that is to be made based on the oxidation rate; and (d) additionally oxidizing the semiconductor layer by the amount of additional oxidation. In this case, it is possible to positively adjust the final amount of oxidation to a target value.

The aforementioned aspects, features and advantages will be apparent from the following detailed description when read in conjunction with the accompanying drawings.

BRIEF DESCRIPTION OF THE DRAWINGS

FIG. 4 is a functional block diagram showing a structure of a control system of the semiconductor oxidation apparatus shown in FIG. 3;

BEST MODE FOR CARRYING OUT THE INVENTION

A description will be given of various embodiments of the semiconductor oxidation apparatus according to the present invention and the method of producing semiconductor element according to the present invention, by referring to FIG. 3 and the subsequent drawings.

First Embodiment

Figure 1:
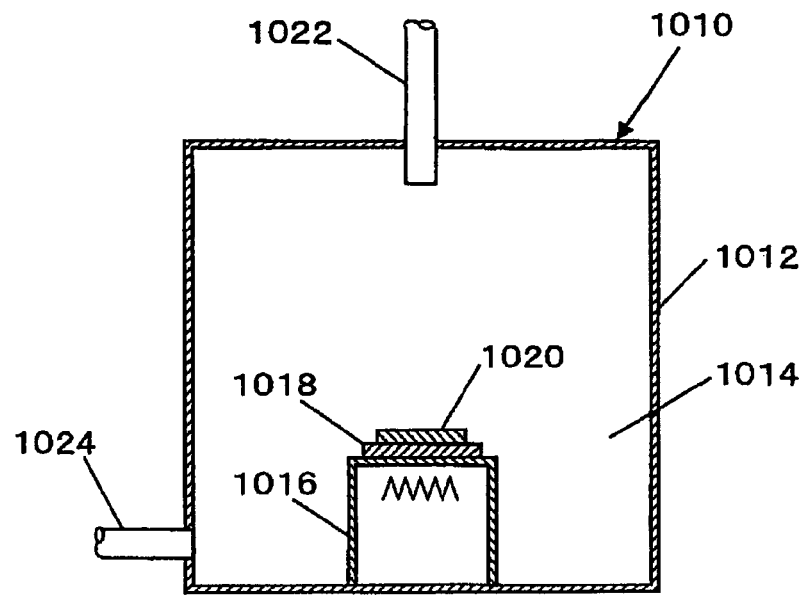
FIG. 1 is a cross sectional view showing a general structure of an example of a conventional oxidation apparatus in a vertical cross section.
Figure 2:
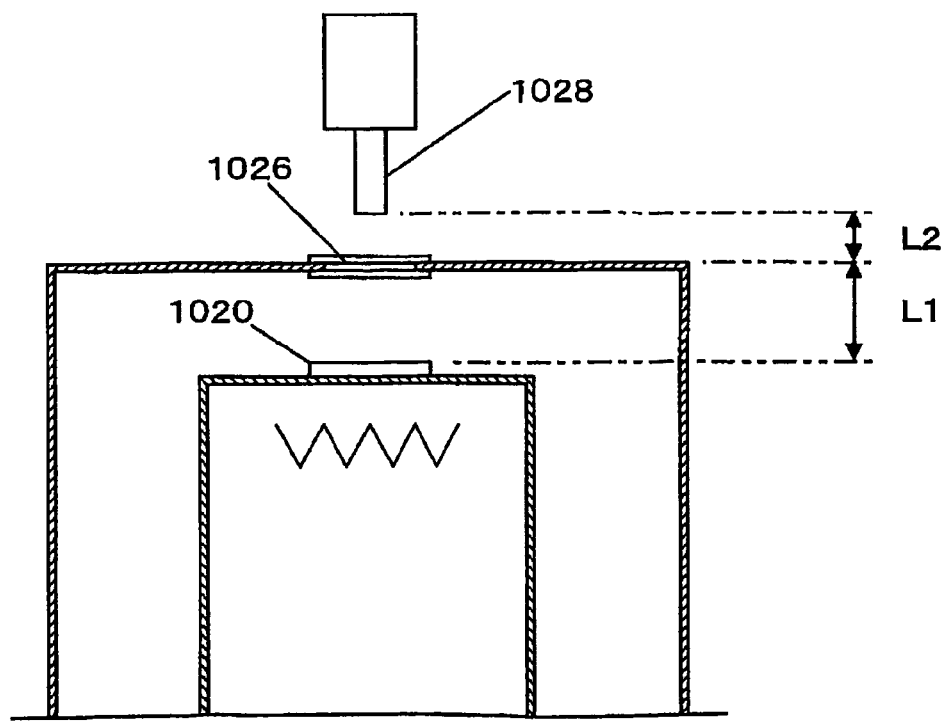
FIG. 2 is a cross sectional view showing a general structure of another example of the conventional oxidation apparatus in a vertical cross section.
Figure 3:
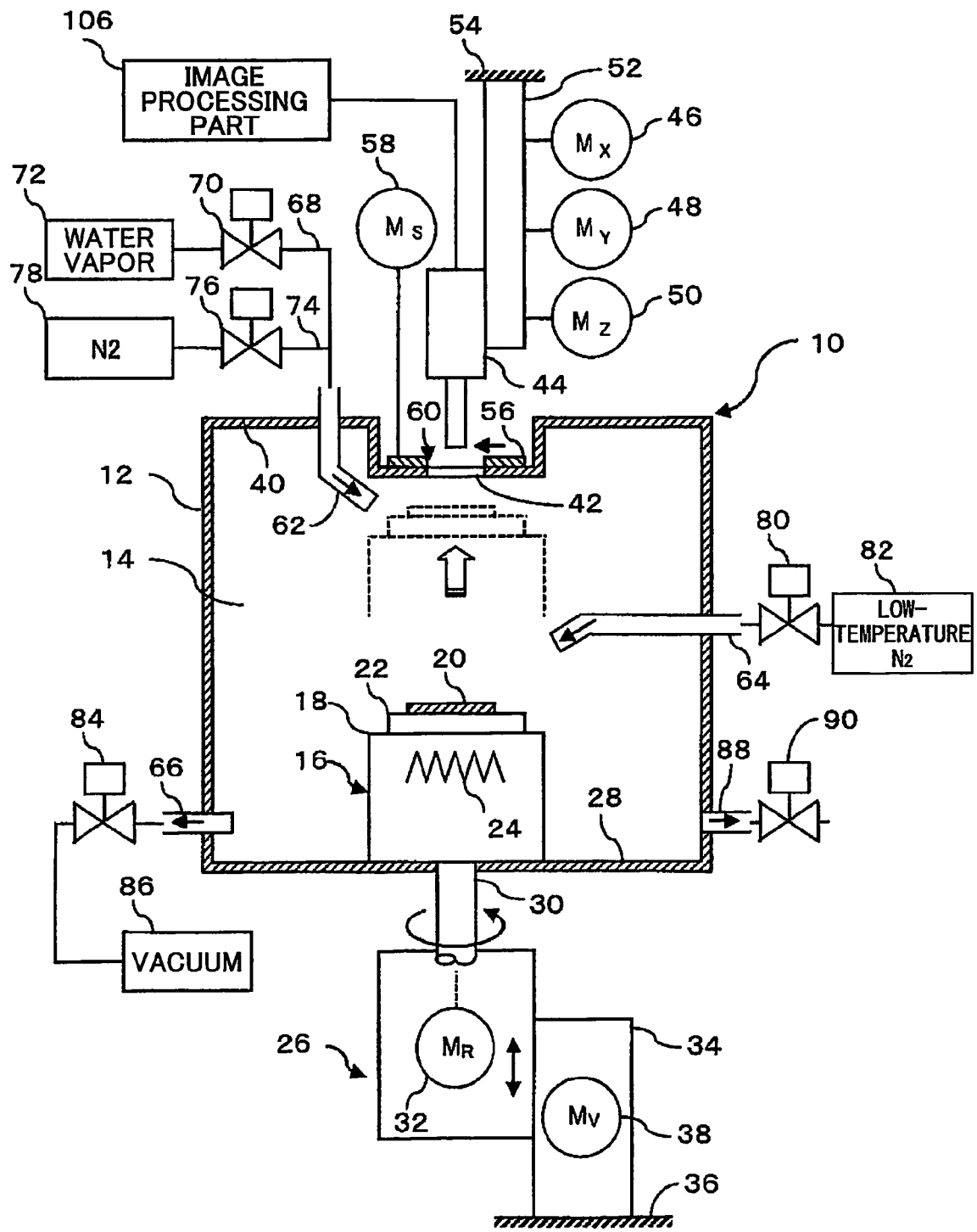
FIG. 3 is a cross sectional view showing a structure of a first embodiment of a semiconductor oxidation apparatus according to the present invention in a vertical cross section.

FIG. 3 is a cross sectional view showing a structure of a first embodiment of the semiconductor oxidation apparatus according to the present invention in a vertical cross section. A semiconductor oxidation apparatus (hereinafter simply referred to as an oxidation apparatus) 10 shown in FIG. 3 has a pressure-tight sealable container (or oxidation chamber) 12 made of a metal such as stainless steel. An internal space 14 having a predetermined size is provided within the oxidation chamber 12, and a base 16 for supporting a semiconductor sample is provided at the bottom of the internal space 14.

In this embodiment, the base 16 is made up of a heating table 18, and a sample table (or substrate holder) 22 that is provided on the heating table 18 and is designed to support thereon a semiconductor sample (substrate made of semiconductor wafer) 20 that is to be oxidized. The heating table 18 has an electric heater 24 for heating the semiconductor sample 20 that is to be oxidized, and is freely rotatable and vertically movable (that is, movable up and down) via a rotation and elevator mechanism (or moving mechanism and base moving mechanism) 26. The sample table 22 is provided with a mechanism (not shown) for fixing the semiconductor sample 20 that is to be oxidized on the sample table 22. The heating table 18 and the sample table 22 may have an integrated structure.

The rotation and elevator mechanism 26 includes a driving shaft 30 that extends vertically in the up and down directions and penetrates a bottom wall 28 of the oxidation chamber 12, a motor 32 that connects to and drives the driving shaft 30 outside the oxidation chamber 12, and an elevator mechanism 34 that moves the motor 32 up and down together with the driving shaft 30. In this embodiment, the elevator mechanism 34 is fixed to a fixing part 36 such as the floor. In addition, the elevator mechanism 34 is formed by a motor 38 and a rack-and-pinion (not shown), but may be formed by an air pressure or an oil pressure cylinder. Accordingly, the heating table 18 and the sample table 22 can rotate in a predetermined direction about the driving shaft 30 based on the driving by the motor 32, together with the semiconductor sample 20 that is fixed on the sample table 22, and can move up and down between an oxidizing position (receded position or lowered position) indicated by a solid line and a monitoring position (raised position) indicated by a dotted line based on the driving by the elevator mechanism 34.

A top wall 40 of the oxidation chamber 12 has a monitoring window 42 that is made of a light transmitting heat-resistant material, at a position above the base 16 and confronting the semiconductor sample 20 that is placed at the monitoring position. A camera 44 provided with a microscope (hereinafter simply referred to as a microscope 44), which forms a monitoring means, is provided above the monitoring window 42 outside the oxidation chamber 12. The microscope 44 is desirably mounted on a fixing base 54 via a camera moving mechanism 52 that has 3 motors 46, 48 and 50 for moving the microscope 44 in 2 mutually perpendicular directions (X and Y directions) on the horizontal plane and in a perpendicular direction (Z direction) to the 2 directions (X and Y directions), with an optic axis of the microscope 44 oriented in the up and down directions. The microscope 44 desirably has an automatic focusing function so that the focal point can be automatically adjusted with a precision on the µm order. In order to minimize the heat that is radiated to the outside via the monitoring window 42 during the oxidation process and to prevent damage to the microscope 44 (thermal deformation of optical parts such as a lens) due to the heat radiated via the monitoring window 42, it is possible to provide a heat blocking mechanism 60. The heat blocking mechanism 60 includes a heat blocking plate 56 that opens and closes to expose and cover the monitoring window 42 on the outer side or the inner side of the monitoring window 42, and a motor 58 or a cylinder that moves the heat blocking plate 56 to open and close. In order to improve the heat blocking effect, the heat blocking plate 56 may be made of a material having a high heat insulating efficiency or, have a surface confronting the internal space 14 made of a reflecting material or processed to be reflecting.

The oxidation chamber 12 is provided with 3 pipes 62, 64 and 66, which penetrate the walls of the oxidation chamber 12, for adjusting the atmosphere within the internal space 14. The first pipe 62 supplies an oxidization atmosphere gas to the internal space 14. The first pipe 62 branches into two outside the oxidation chamber 12, with one branching pipe 68 connecting to a water vapor supply source (or water vapor supply part) 72 via a solenoid-operated valve (hereinafter simply referred to as a solenoid valve) 70, and another branching pipe 74 connecting to a nitrogen supply source (or nitrogen supply part) 78 via a solenoid valve 76. Hence, an oxidation gas that is a mixture of the water vapor supplied from the vapor supply source 72 and the nitrogen supplied from the nitrogen supply source 78 is supplied to the internal space 14. As shown in FIG. 3, the outlet end of the first pipe 62 is desirably directed towards a space above the semiconductor sample 20 that is placed at the oxidizing position, so that it is possible to sufficiently supply the oxidation gas to the semiconductor sample 20 during the oxidation process. As will be described later, the second pipe 64 supplies a low-temperature nitrogen gas, as an inert gas, for replacing the atmosphere within the internal space 14 to nitrogen and for cooling the semiconductor sample 20, when the oxidation process is interrupted. The second pipe 64 is connected to a low-temperature nitrogen gas supplying source (or low-temperature nitrogen gas supply part) 82 via a solenoid valve 80. For the purpose of cooling the semiconductor sample 20, the outlet end of the second pipe 64 is desirably directed to the semiconductor sample 20 at the oxidizing position or to a space above the semiconductor sample at the oxidizing position, so that the supplied low-temperature nitrogen gas is sprayed or blasted on the semiconductor sample 20. The third pipe 66 exhausts the residual oxidation gas within the internal space 14 when the oxidation process is interrupted. The third pipe 66 is connected to a vacuum source 86 via a solenoid valve 84. A fourth pipe 88 further penetrates the wall of the oxidation chamber 12. This fourth pipe 88 is connected to a solenoid valve 90 for flow. By maintaining the solenoid valve 90 in an open state during the oxidation process, it is possible to push out via the fourth pipe 88 an amount of water vapor gas in accordance with the supplied amount, while maintaining the flow or circulation state of the water vapor within the internal space 14.

FIG. 4 is a functional block diagram showing a structure of a control system 100 of the oxidation apparatus 10 shown in FIG. 3. As shown in FIG. 4, the control system 100 includes a control apparatus 102. This control apparatus 102 includes a central processing unit (CPU) 104. The CPU 104 is connected to an image processing part 106 that processes data of an image picked up by the microscope 44, a display part (or monitor) 106 that displays the image picked up by the microscope 44, the motors 32 and 38 of the rotation and elevator mechanism 26, the motors 46, 48 and 50 of the camera moving mechanism 52 that move the microscope 44 in the X, Y and Z directions, a motor control part 110 that controls the motor 58 of the heat blocking mechanism 60, a solenoid valve control part 112 that controls the solenoid valves 70, 76, 80, 84 and 90, and a heater control part 114 that controls the heater 24 by PID. The control apparatus 102 also has a storage part 116 that stores programs, information and the like necessary to execute the oxidation process (including an interruption process) that will be described later, and an operation part 118 that executes operation processes that will be described later.

Figure 5A:
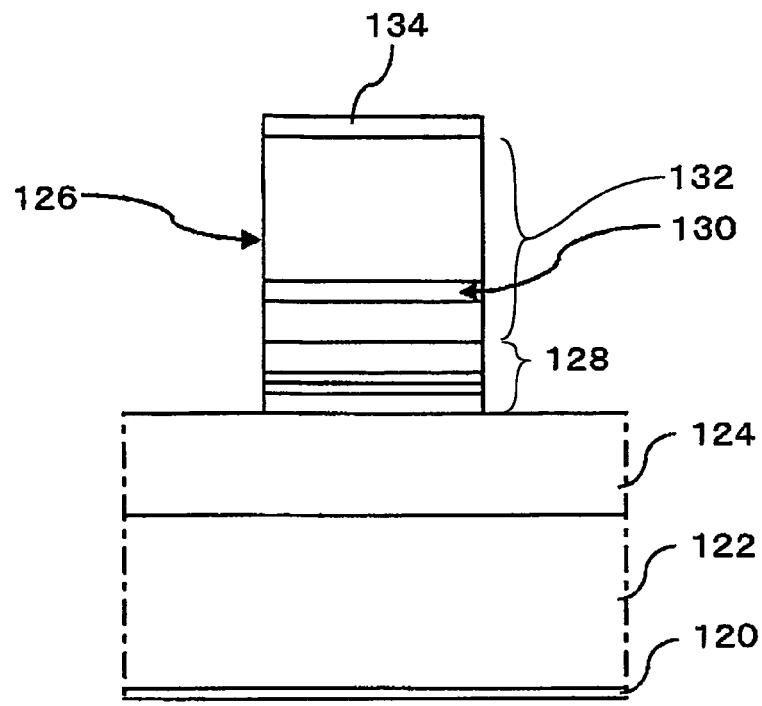
FIG. 5A is a cross sectional view, in part, showing a semiconductor sample that is to be subjected to an oxidation process by the semiconductor oxidation apparatus shown in FIG. 3 prior to the oxidation.

When forming an oxidized layer of the VCSEL using the oxidation apparatus 10, the semiconductor sample 20 prior to the oxidation process has a cross sectional structure shown in FIG. 5A, for example. The cross sectional structure shown in FIG. 5A includes an n-electrode 120, an n-GaAs substrate 122, and a lower semiconductor distributed Bragg reflection (DBR) mirror 124 in this order from the bottom, and a mesa 126 is supported on the lower semiconductor distributed Bragg reflection (DBR) mirror 124 at a constant density (at predetermined intervals in the X and Y directions). The mesa 126 includes an active region 128, an upper semiconductor distributed Bragg layer 132, and a contact layer 134 in this order from the bottom. The upper semiconductor distributed Bragg layer 132 includes a selectively oxidizing layer 130 which is to be selectively oxidized. The selectively oxidizing layer 130 includes Al and As, and is partially oxidized after this layer 130 is selectively oxidized as will be described later. In addition, the mesa 126, when viewed from the top towards the bottom in FIG. 5A, has a circular shape, an oval shape, a quadrangle shape (square or rectangular shape) or a polygonal shape other that the quadrangle shape.

Figure 6:
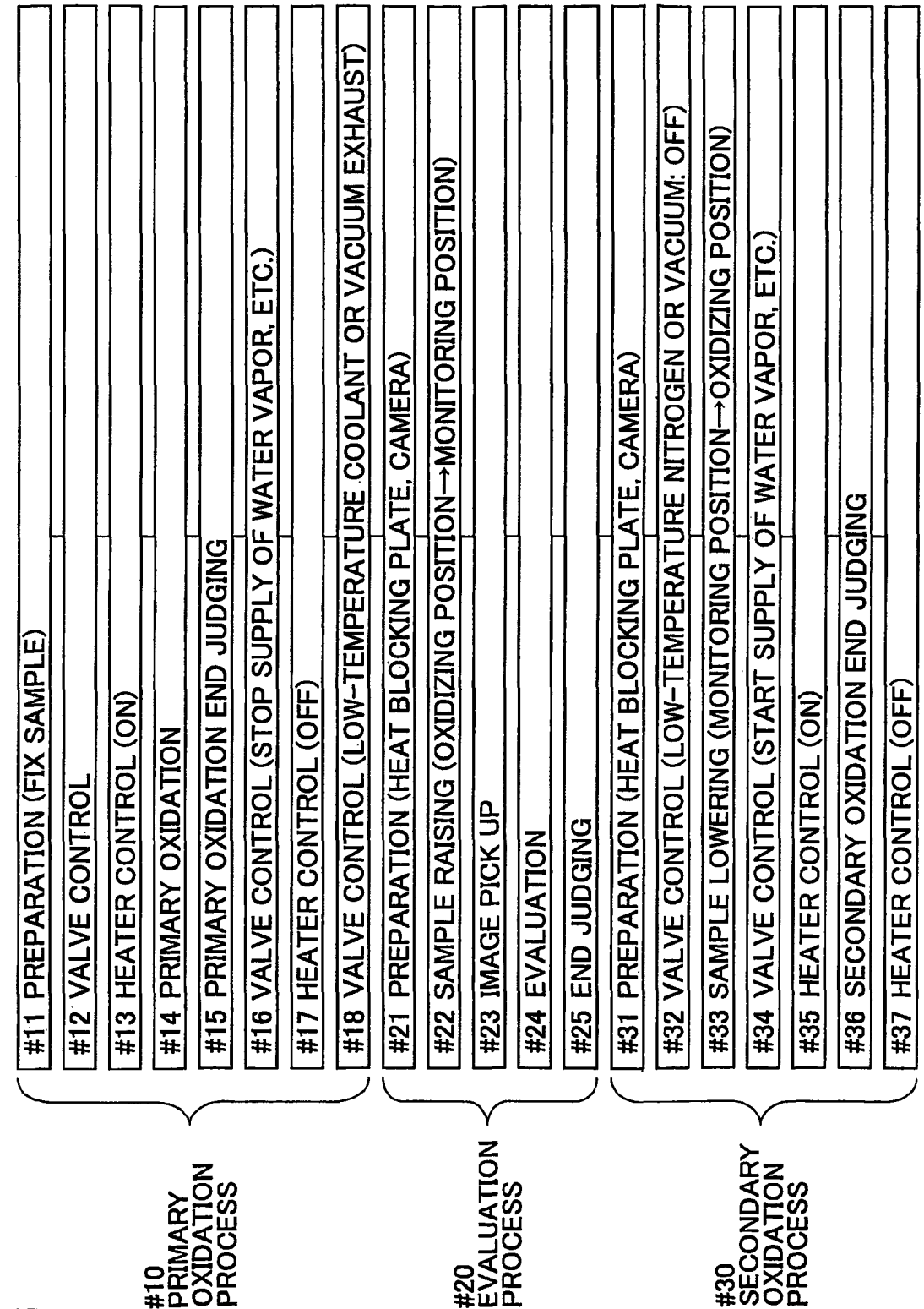
FIG. 6 is a flow chart for explaining a semiconductor element producing method using the semiconductor oxidation apparatus shown in FIG. 3.

FIG. 6 shows an oxidation process for oxidizing a selectively oxidizing layer 130 of the semiconductor sample 20 having the cross sectional structure described above using the oxidation apparatus 10. The oxidation process shown in FIG. 6 generally includes a primary oxidation process #10 for carrying out a primary oxidation with respect to the selectively oxidizing layer 130, an evaluation process #20 for temporarily stopping the oxidation from progressing and evaluating the amount of oxidation (or oxidation rate), and a secondary oxidation process #30 for oxidizing the selectively oxidizing layer 130 to a final target amount of oxidation based on the evaluation result of the amount of oxidation.

In the primary oxidation process #10, the semiconductor sample 20, which has the cross sectional structure described above and has not yet been oxidized, is placed and fixed on the sample table 22 by a preparation step #11. In this state, the base 16 including the sample table 22 is fixed to the oxidizing position (or lowered position). If necessary, the control apparatus 102 opens the exhausting solenoid valve 84 via the solenoid valve control part 112, and exhausts the residual atmosphere within the internal space 14. The other solenoid valves 70, 76 and 80 are closed in this state. Further, if necessary, the control apparatus 102 drives the motors 46, 48 and 50 of the camera moving mechanism 52, and moves the microscope 44 to a position separated from the monitoring window 42 or, to a position receded from the region confronting the monitoring window 42. If the heat blocking plate 56 for exposing and covering the monitoring window 42 is provided, the motor 58 is driven to move the heat blocking plate 56 to a closed position to cover the monitoring window 42.

Figure 7A:
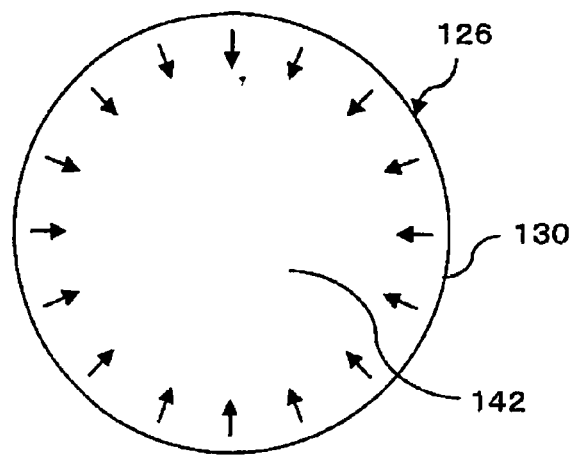
FIGS. 7A through 7C are diagrams for explaining an oxidation process with respect to an oxidizing portion.
Figure 7B:
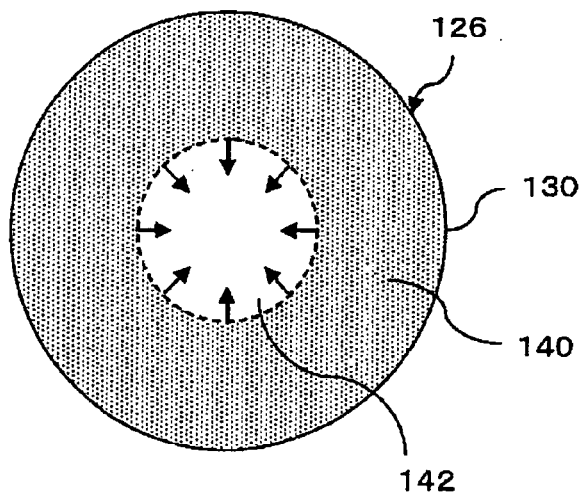
Figure 7C:
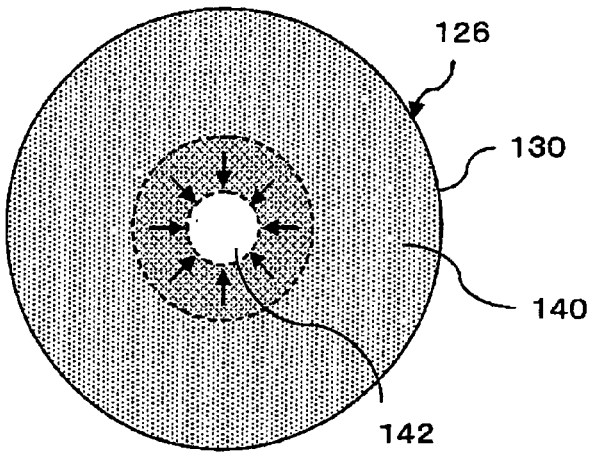

Next, the control apparatus 102 closes the exhausting solenoid Valve 84 and the low-temperature nitrogen gas supplying solenoid valve 80 and opens the water vapor supplying solenoid valve 70 and the nitrogen supplying solenoid valve 76, to supply the mixture gas of water vapor and nitrogen to the internal space 14 by a solenoid valve control step #12. In addition, while the mixture gas is supplied to the internal space 14, the control apparatus 102 opens the solenoid valve 90, so that a circulation state of the water vapor gas within the internal space 14 of the oxidation chamber 12 is formed, and at the same time, a state is formed such that the water vapor gas is pushed out via the pipe 88. Instead of opening the solenoid valve 90, it is possible to open the solenoid valve 84 to exhaust the water vapor gas from the internal space 14 of the oxidation chamber 12, and at the same time, maintain the internal space 14 to a constant pressure (decompression state or atmospheric pressure state), so as to form the circulation state of the water vapor gas within the internal space 14. Next, the control apparatus 102 turns the heater 24 ON via the heater control part 114 by a heater control step #13. Hence, an oxidation gas made up of water vapor and nitrogen fills the internal space 14 of the oxidation chamber 12, and the internal space 14 is adjusted to a temperature state necessary for the oxidation of the semiconductor sample 20, so as to start the oxidation of the selectively oxidizing layer 130 of the semiconductor sample 20 by a primary oxidation step #14. The oxidation of the selectively oxidizing layer 130 progresses from the peripheral end of the selectively oxidizing layer 130 exposed at the outer peripheral side surface of the mesa 126 in a radial direction towards the inner side. For example, in a case where the mesa 126 has a circular flat shape, an oxidized region 140 gradually progresses from the peripheral end towards the center, and a circular non-oxidized region 142 having a shape similar to the circular flat shape of the mesa 126 remains on the inner side the ring-shaped oxidized region 140, as may be seen from FIGS. 7A through 7C.

Figure 8:
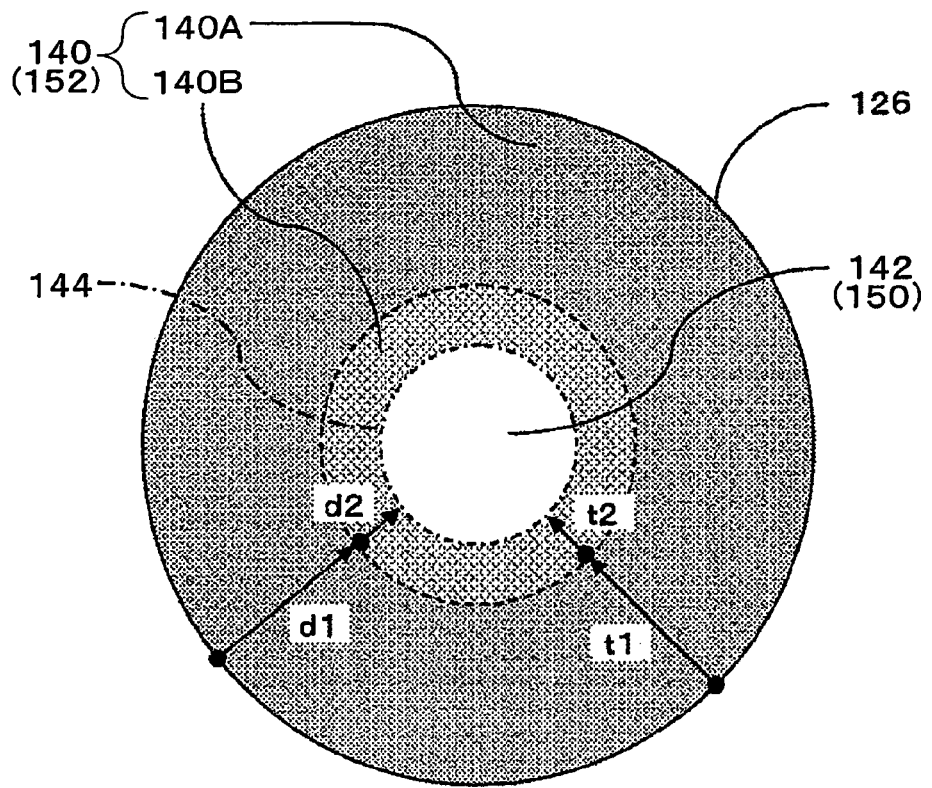
FIG. 8 is a diagram for explaining an oxidation process with respect to an oxidizing part in conjunction with FIGS. 7A through 7C.

The control apparatus 102 judges the end of the primary oxidation by a primary oxidation end judging step #15. More particularly, in a case where the entire oxidation process is completed in a state where the non-oxidized region 142 having a predetermined size remains at the center (final oxidized state) as shown in FIG. 8, the oxidation is interrupted before a primary oxidized region 140A which is oxidized by the primary oxidation reaches the final oxidized state (final oxidized position 144), that is, by leaving a slight or small secondary oxidizing region (or additionally oxidizing region) 140B. The timing at which the oxidation is interrupted (primary oxidation time) may be obtained from experience based on the time it takes to complete the oxidation. For example, the control apparatus 102 stores in the storage part 116 a primary oxidation time t1 (=t−Δt) which is obtained by subtracting a predetermined time Δt from a total required oxidation time t that is obtained from experience, and judges the end of the primary oxidation at a time when the elapsed time from the start of the oxidation reaches the primary oxidation time t1. When the control apparatus 102 judges the end of the primary oxidation, the control apparatus 102 closes the water vapor supplying solenoid valve 70 and the nitrogen supplying solenoid valve 76 by a solenoid valve control step #16. The control apparatus 102 stops the heater 24 before the solenoid valves 70 and 76 are closed or, after the solenoid valves 70 and 76 are closed, by a heater control step #17. Then, the control apparatus 102 opens the rapid-cooling low-temperature nitrogen gas supplying solenoid valve 80, and replaces atmosphere within the internal space 14 by nitrogen to cool the internal space 14 by a solenoid valve control step #18. Since the outlet end of the low-temperature nitrogen gas supplying pipe 64 is directed towards the semiconductor sample 20 as described above, the low-temperature nitrogen gas supplied from the pipe 64 is directly sprayed or blasted onto the semiconductor sample 20, to thereby virtually stop or completely stop the progress of the oxidation. Instead of supplying the low-temperature nitrogen gas, it is possible to open the exhausting solenoid valve 84 and exhaust the water vapor from the internal space 14. In this case, the progress of the oxidation similarly stops. In addition, while the oxidation is interrupted, in a state where the supply of the water vapor and nitrogen is stopped by closing the water vapor supplying solenoid valve 70 and the nitrogen supplying solenoid valve 76, the circulation state of the nitrogen gas within the internal space 14 may be maintained by opening the low-temperature nitrogen gas supplying solenoid 80 and the flow solenoid valve 90 or, nitrogen may be exhausted while maintaining the internal space 14 to a constant pressure by the vacuum source 86 by opening the low-temperature nitrogen gas supplying solenoid valve 80 and the exhausting solenoid valve 84 instead.

Next, in the evaluation process #20, in a case where the oxidation apparatus 10 has the heat blocking mechanism 54 including the heat blocking plate 56, the control apparatus 102 drives the motor 58 and moves the heat blocking plate 56 from above the monitoring window 42 to an open position so as to expose the monitoring window 42. In a case where the oxidation apparatus 10 has the camera moving mechanism 52 and the microscope 44 is at the receded position separated from the monitoring window 42 or the oxidation chamber 12 during the oxidation process, the control apparatus 102 drives the camera moving mechanism 52 and moves the microscope 44 to the position confronting the monitoring window 42. These operations of the control apparatus 102 with respect to the heat blocking mechanism 54 and the camera moving mechanism 52 are made in a preparation step #21. Then, the control apparatus 102 drives the elevator motor 38 to raise the base 16 to the monitoring position so that the semiconductor sample 20 confronts the microscope 44 via the monitoring window 42 by a sample raising step #22. The control apparatus 102 further starts the microscope 44 to acquire an enlarged image of the mesa 126 by an image pickup (or photo taking) step #23. Because the microscope 44 has an automatic focusing mechanism, the microscope 44 automatically matches the focal point (that is, focuses) on the mesa 126. Accordingly, as shown in FIG. 8, a boundary between the oxidized region 140 that has been oxidized by the primary oxidation and the non-oxidized region can be clearly recognized on the acquired enlarged image. The data of the image picked up by the microscope 44 are supplied to the image processing part 106 wherein necessary image processings are made. The image data after the image processing are stored in the storage part 116 if necessary. In addition, the enlarged image of the mesa 126 is displayed on the display part 108 using the image data after the image processing. Moreover, the image data after the image processing are supplied to the operation part 118 wherein the amount of oxidation (oxidation time t2) of the secondary oxidation is calculated by an evaluation step #24.

A description will be given of an example of the calculation made in the operation part 118, by referring to FIG. 8. The oxidation rate is represented by a distance d from the outer peripheral end of the circular mesa 126 to the inner peripheral end of the ring-shaped oxidized region 140 along an imaginary line passing the center of the circular mesa 126, for example. The operation part 118 calculates the amount (=Δd2) to be oxidized by the secondary oxidation, from the oxidation rate (=distance d1) and the size (distance from the outer peripheral end of the circular mesa 126 to the final oxidized position 144) of the non-oxidized region 142 which is the final target. Then, the operation part 118 divides the amount of oxidation (distance d1) by the time t1 required for the primary oxidation, and obtains the amount of oxidation per unit time (oxidation rate coefficient $\alpha = d1/t1$). Finally, the operation part 118 obtains the time required for the secondary oxidation (that is, the secondary oxidation time) from $t2 = d2/\alpha$.

The control apparatus 102 judges the end of the evaluation process #20 by an end judging step #25.

Next, in the secondary oxidation process #30, the preparations necessary for the secondary oxidation are made in a preparation step #31. For example, the control apparatus 102 drives the motors 46, 48 and 50 of the camera moving mechanism 52, and moves the microscope 44 to the position separated from the monitoring window 42 or, to a position receded from the region confronting the monitoring window 42. If the heat blocking plate 56 for exposing and covering the monitoring window 42 is provided, the motor 58 is driven to move the heat blocking plate 56 to the closed position to cover the monitoring window 42. Then, the control apparatus 102 closes the low-temperature nitrogen supplying solenoid valve 80 by a valve control step #32. If the exhausting solenoid valve 84 is opened instead of supplying the low-temperature temperature nitrogen gas, this exhausting solenoid valve 80 is closed. In addition, the motor 38 of the elevator mechanism 34 is driven to lower the base 16 to the oxidizing position by a sample lowering step #33. The control apparatus 102 then opens the water vapor supplying solenoid valve 70 and the nitrogen supplying solenoid valve 76, and supplies the mixture gas of water vapor and nitrogen to the internal space 14 by a solenoid valve control step #34. In addition, in a case where the heater 24 is stopped at the time when the primary oxidation process #10 ends, the control apparatus 102 again drives the heater 24 by a heater control step #35. As a result, the oxidation of the selectively oxidizing layer 130 is restarted, and the oxidized region 140 is enlarged towards the inner side while the non-oxidized region 142 becomes smaller. The duration (time) of the secondary oxidation process #30 is measured, and when the measured time reaches the secondary oxidation time t2 described above, the control apparatus 102 judges the end of the secondary oxidation by a secondary oxidation end judging step #36. Finally, when the control apparatus 102 judges the end of the secondary oxidation, the control apparatus 102 closes the water vapor supplying solenoid valve 70 and the nitrogen supplying solenoid valve 76 by a solenoid valve control step #36, and stops the heater 24 by a heater control step #37, to thereby end the secondary oxidation process #30. When ending the oxidation process, it is desirable to open the low-temperature nitrogen gas supplying solenoid valve 80 and spray or blast the low-temperature nitrogen gas onto the semiconductor sample 20.

Figure 5B:
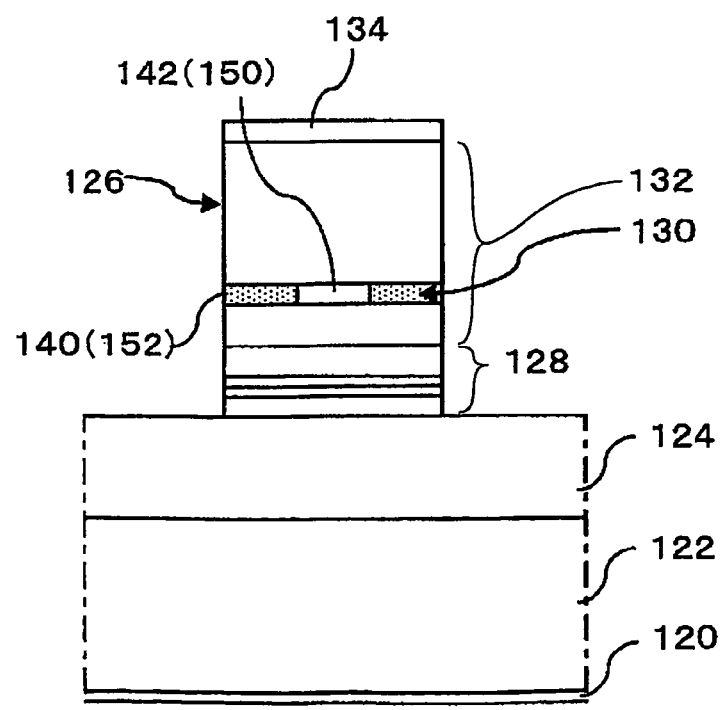
FIG. 5B is a cross sectional view, in part, showing the semiconductor sample that is subjected to the oxidation process by the semiconductor oxidation apparatus shown in FIG. 3 after the oxidation.
Figure 9:
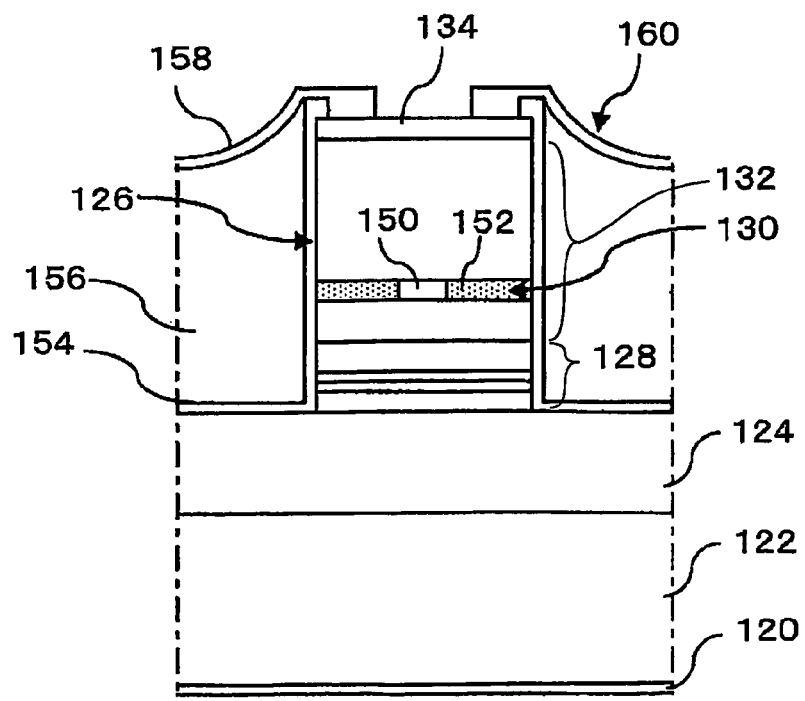
FIG. 9 is a cross sectional view showing a structure of a semiconductor laser that is formed using the semiconductor sample after the oxidation.

As shown in FIGS. 5B and 8, the non-oxidized region 142 having the predetermined size and the oxidized region 140 surrounding the periphery of the non-oxidized region 142 are formed on the mesa 126 after the secondary oxidation process #30 ends. The non-oxidized region 142 and the oxidized region 140 respectively become a current injecting part 150 and a current constricting part 152. The semiconductor sample 20 that is formed with the current injecting part 150 and the current constricting part 152 is thereafter subjected to the necessary thin-film forming process, to form a VCSEL 160 shown in FIG. 9. This VCSEL 160 includes an insulator layer 154 made of $SiO_2$ or the like, an insulator layer 156 made of a polyimide or the like, and a p-electrode 158.

According to the oxidation apparatus 10 of this embodiment, the selectively oxidizing layer 130 of the semiconductor sample 20 is oxidized to a certain extent by the primary oxidation process, and the amount of oxidation (oxidation rate) of the primary oxidation is thereafter obtained in a state where the progress of the oxidation is temporarily stopped, so as to determine the amount of oxidation (oxidation time) of the secondary oxidation process that remains to be made by feeding back the result of the primary oxidation process. Accordingly, the size of the current injecting part that is finally formed is virtually the target size or is exactly the target size. In order to match the amount of oxidation at the time when the secondary oxidation ends to the target amount of oxidation, it is desirable that the ratio ($=d1/(d1+d2)$) (%) of the amount of primary oxidation (d1) with respect to the total amount of oxidation ($=d1+d2$) takes a value that is as large as possible. For example, the ratio ($=d1/(d1+d2)$) (%) is 80% to 95%, and preferably 85% to 95%, and more preferably 90% to 95%.

In the description given above, it is assumed that the mesa 126 has the flat circular shape, and the amount of oxidation is obtained in terms of the mesa diameter (d1, d2). However, the amount of oxidation may also be evaluated by the area. In this case, an oxidation rate coefficient $\alpha$(=(area of selectively oxidizing area prior to oxidation)−((area of non-oxidized region at the time when the primary oxidation ends)/(oxidation time))) may be obtained from the ratio of the non-oxidized area at the time when the oxidation ends with respect to the area of the final target non-oxidized region, so as to obtain the amount of oxidation (oxidation time) of the secondary oxidation based on the oxidation rate coefficient $\alpha$.

[First Modification]

In the first embodiment described above, the base 16 and the semiconductor sample 20 are fixed to a predetermined position during the oxidation. However, in a first modification of the first embodiment of the present invention, the rotation mechanism (rotation and elevator mechanism 26) of the base 16 may be driven to rotate the semiconductor sample 20 during the oxidation. In this case, the spatial position of each mesa 126 changes with time, and it is possible to uniformly oxidize the selectively oxidizing layer 130 of each mesa 126, to thereby improve the yield of the VCSEL 160.

[Second Modification]

In the first embodiment described above, the secondary oxidation process is carried out based on the evaluation result of the primary oxidation process, and the size of the final non-oxidized region (current injecting part) is not confirmed. However, in a second modification of the first embodiment, the size of the non-oxidized region is measured after the secondary oxidation process ends, and based on the measured size of the non-oxidized region, a third oxidation process is additionally carried out if necessary. In this case, the size of the non-oxidized region is measured after the secondary oxidation process, and based on the measured result, an amount of oxidation of the third oxidation process and the oxidation time required for the third oxidation process are calculated similarly as described above, to carry out the third oxidation process based on the calculated amount of oxidation and oxidation time.

It is preferable that the amount of oxidation for the primary oxidation process and the secondary oxidation process are evaluated for the same mesa. When not rotating the base 16 and the semiconductor sample 20 during the oxidation, the measurement of the amount of oxidation for the primary oxidation process and the amount of oxidation for the secondary oxidation process can be measured for the same mesa by matching the focal point of the microscope 44 (that is, the camera) to a predetermined plane coordinate (XY coordinate).

Figure 10:
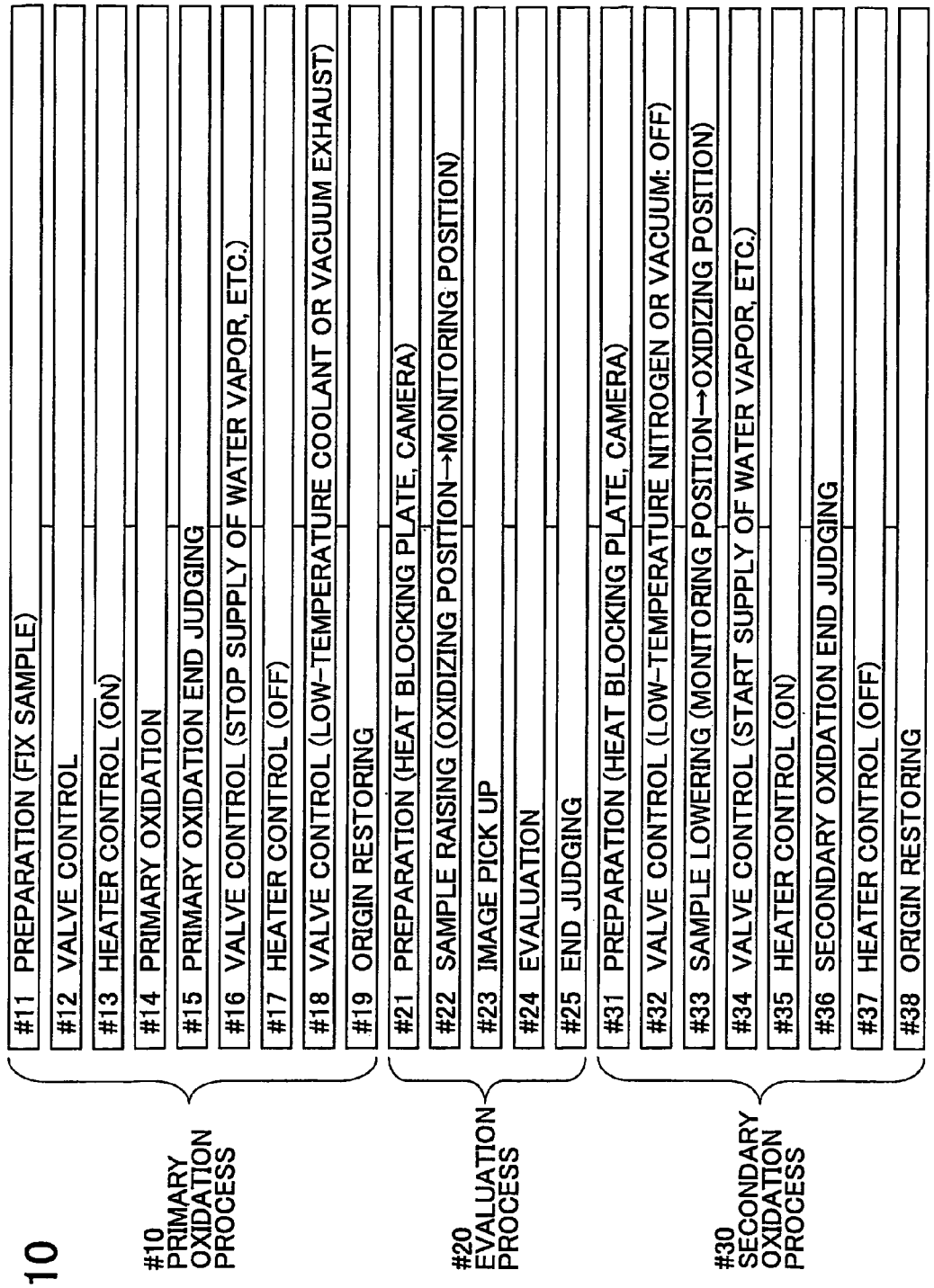
FIG. 10 is a flow chart for explaining another semiconductor element producing method using the semiconductor oxidation apparatus shown in FIG. 3.

When rotating the base 16 and the semiconductor sample 20 during the oxidation, the mesa that is the evaluation target and located at the focal point of the microscope 44 at the time when the primary oxidation process ends may have moved at the time when the secondary oxidation process ends, and in this case, the evaluation target mesa is not located at the focal point of the microscope 44 at the time when the secondary oxidation process ends. In order to eliminate this problem, another semiconductor element producing method may be employed as shown in FIG. 10. FIG. 10 is a flow chart for explaining this other semiconductor element producing method using the semiconductor oxidation apparatus shown in FIG. 3. In FIG. 10, those steps that are the same as those corresponding steps in FIG. 6 are designated by the same reference numerals, and a description thereof will be omitted. In FIG. 10, an origin restoring step #19 is carried out to restore the base 16 to the position of the origin after the primary oxidation ends, and an origin restoring step #38 is carried out to restore the base 16 to the position of the origin after the secondary oxidation ends.

Figure 11:
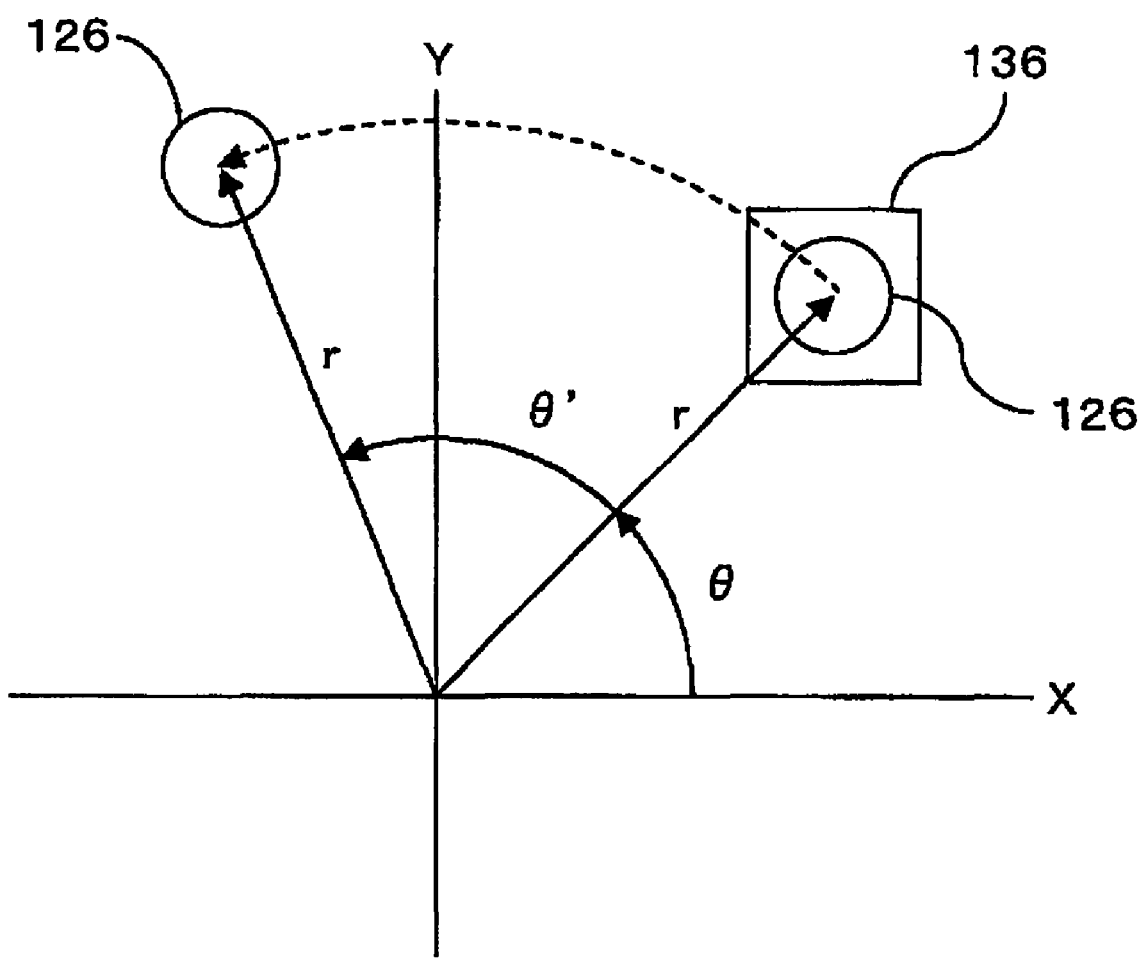
FIG. 11 is a diagram for explaining an origin restoring step.

In order to carry out an origin restoring step, it is preferable to use for the motor 32 that rotates the base 16 a servo motor having an encoder provided with an origin position (Z-phase). More particularly, a description will be given of the origin restoring step using the Z-phase of the servo motor. Suppose that the focal point of the microscope 44 (that is, the camera) exists at a position (r, θ) moved by a predetermined distance (x0, y0) in the X and Y directions from a center (origin of the XY coordinate system) of the driving shaft 30 as shown in FIG. 11, that the evaluation target mesa 126 is located at this camera focal point, and that the servo motor is stopped in a state where a predetermined number of pulses have been output from the Z-phase output at a time when the primary oxidation process or the secondary oxidation process starts. In order to simplify matters for the sake of convenience, it is assumed that the predetermined number of pulses is zero. Under these conditions, suppose that the evaluation target mesa 126 has stopped at a coordinate (r, θ+θ′) moved by an angle θ′ from the camera focal point at the time when the primary or secondary oxidation process ends. In this case, the control apparatus 102 stores a number $N_θ$ of pulses from a time when the Z-phase of the servo motor is output to a time when the rotation thereof stops. The number $N_θ$ of pulses corresponds to the moved angle θ". Accordingly, in the origin restoring step, the control apparatus 102 calculates the moved angle θ' from the number $N_\theta$ of pulses output from the servo motor, and calculates an angle (360°-θ') required to rotate and restore the rotary shaft of the servo motor to the angular position at the time prior to the oxidation process and a number $N_{(360°-\theta)}$ of pulses corresponding to the angle (360°-θ'). In addition, the control apparatus 102 rotates the rotary shaft of the servo motor until the number $N_{(360°-\theta)}$ of pulses is output from the servo motor, so as to move the evaluation target mesa 126 to within a camera field (or field of view) 134. Therefore, the amount of oxidation after the primary oxidation process and the secondary oxidation process can be evaluated with respect to the same mesa 126.

Another simple method may be used in place of the above method using the Z-phase of the servo motor. In other words, a detection part (for example, a projection, cutout, read mark, magnet, and the like) that is to be detected is mounted on the driving shaft 30 or on another rotary member (for example, gear) that is linked to be driven by the driving shaft 30. On the other hand, a detector is provided in a vicinity of the detection part. In the origin restoring step prior to the evaluation process, the driving shaft 30 is rotated until the detector detects the detection part, so as to restore the rotary position of the driving shaft 30. The detector may use optical detection, a mechanical detection, an electromagnetic detection or a detection employing an arbitrary combination of such detections.

In order to positively move the evaluation target mesa 126 within the camera field, the origin restoring step preferably rotates the base 16 and the driving shaft 30 at a speed that is slower than that at the time of the oxidation. Accordingly, a motor that can switch its rotational speed between a high speed and a low speed is preferably used for the motor 32 that rotates the base 16.

[Third Modification]

Figure 12:
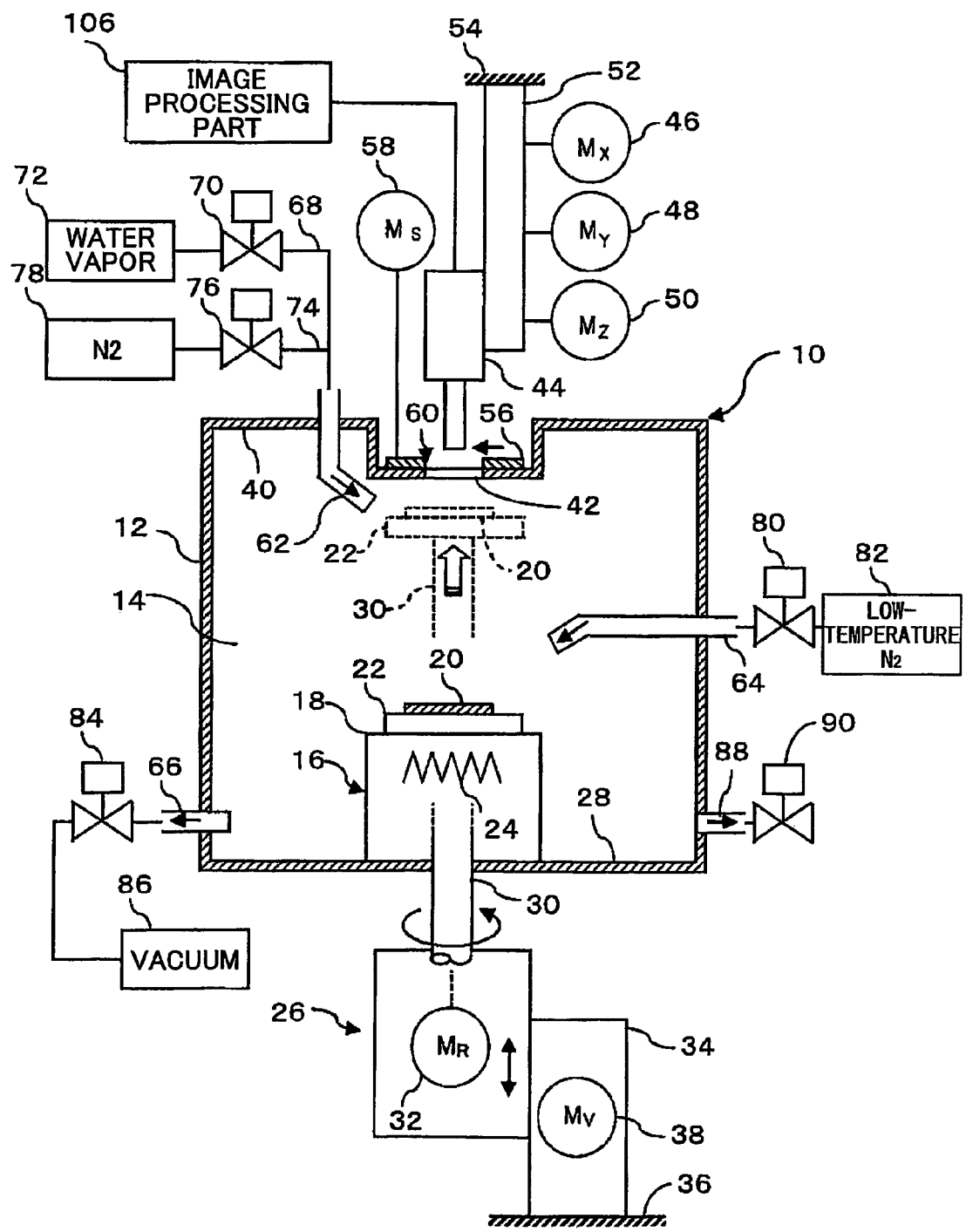
FIG. 12 is a cross sectional view showing a structure of a second embodiment of the semiconductor oxidation apparatus according to the present invention in a vertical cross section.

In the first embodiment described above, the base 16 is formed by integrally combining the heating table 18 and the sample table 22. However, in a third modification of the first embodiment, the heating table 18 is fixed to the oxidation chamber 12, and only the sample table 22 is movable between the oxidizing position (lowered position) and the monitoring position (raised position) with respect to the heating table 18. In this case, as shown in FIG. 12, the driving shaft 30 penetrates within the heating table 18, and the sample table 22 is supported on this penetrating driving shaft 30. According to this oxidation apparatus 10 having the structure shown in FIG. 12, the semiconductor sample 20 can be separated from the heater 24 when interrupting the oxidation and after the oxidation. Consequently, the cooling speed of the semiconductor sample 20 becomes fast, and the oxidation can be interrupted and ended positively. In addition, the amount of oxidation within the semiconductor sample 20 can be maintained uniform and to a target value.

[Fourth Modifications]

According to the first embodiment and the first modification thereof, the semiconductor sample and the table that supports the semiconductor sample are raised towards the monitoring window that is provided at an upper portion of the oxidation chamber when interrupting the oxidation. But in this fourth modification of the first embodiment, a monitoring room is provided on the side of the oxidation chamber, and the semiconductor sample and the sample table that supports the semiconductor sample are moved horizontally to the monitoring room when monitoring the semiconductor sample. A monitoring means may be provided at a ceiling part of the monitoring room, so as to monitor and evaluate the amount of oxidation of the semiconductor sample from above. In this case, the height of the ceiling part of the monitoring room, that confronts the sample table that moves horizontally from the oxidation chamber to the monitoring room, is preferably set low so that the monitoring means may monitor the semiconductor sample from a closely adjacent position. In addition, although the embodiment and the modifications described above use the solenoid valves to control the supply and exhaust of the water vapor, nitrogen and the like, it is of course possible to use other types of valves instead.

Figure 13:
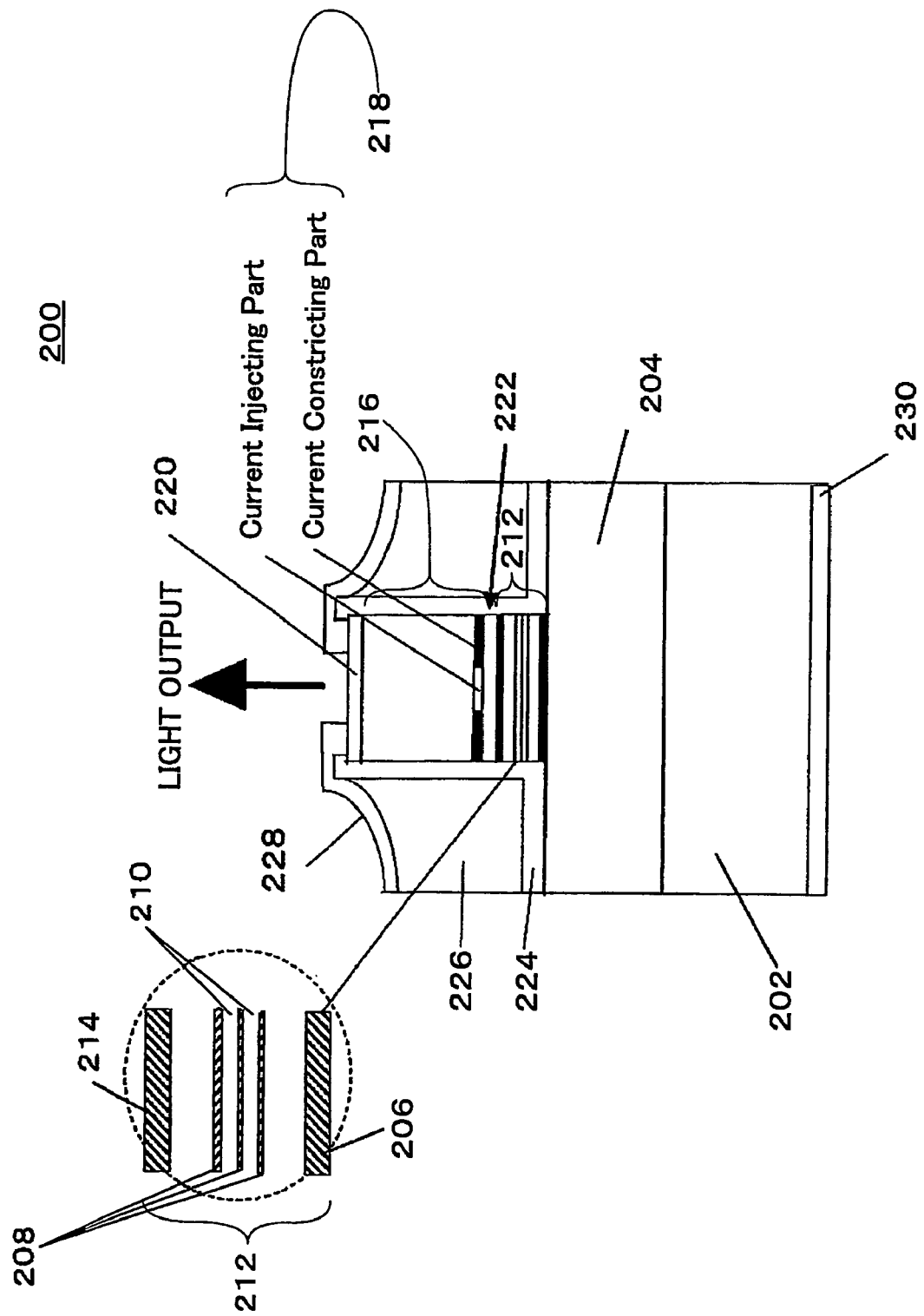
FIG. 13 is a cross sectional view showing a structure of a VCSEL produced by the first embodiment.

FIG. 13 is a cross sectional view showing a structure of a VCSEL produced by the first embodiment. A VCSEL 200 shown in FIG. 13 outputs a laser oscillation having a wavelength of 1.3 μm, and has an n-GaAs substrate 202 having a <100> face orientation of 3-inch size. An n-$Al_xGa_{1-x}As$ (x=0.9) layer and an n-GaAs layer are alternately stacked for 35.5 periods on the substrate 202, to form a periodic structure having a thickness that is ¼ the oscillation wavelength within the medium and forming an n-semiconductor distributed Bragg reflection mirror (hereinafter referred to as a lower semiconductor DBR mirror or simply lower DBR mirror) 204. A multi-quantum well active region 212, including an undoped lower GaAs spacer layer 206 and an undoped upper GaAs spacer layer 214, is formed on the lower DBR mirror 204. The multi-quantum well active region 212 further includes GaInNAs well layers 208 and GaAs barrier layers 210 that are alternately stacked between the undoped upper and lower GaAs spacer layers 214 and 206. There are 3 GaInNAs well layers 208 and 2 GaAs barrier layers 210 in the multi-quantum well active region 212.

A p-semiconductor distributed Bragg reflection mirror (hereinafter referred to as an upper semiconductor distributed DBR or simply upper DBR mirror) 216 is formed on the spacer layer 214. A C-doped p-$Al_xGa_{1-x}As$ (x=0.9) layer and a p-GaAs layer are alternately stacked for 25 periods, for example, to form a periodic structure having a thickness that is ¼ the oscillation wavelength within the medium and forming the upper DBR mirror 216. A selectively oxidizing layer 218 made of AlAs and having a thickness of 30 nm, for example, is formed at a lower part within the upper DBR mirror 216. A GaAs contact layer 220 at an uppermost part of the upper DBR mirror 216 also functions as a contact layer for making contact with the electrode. The In composition x is 33% and the nitrogen composition is 1.0% for the well layer 208 within the active region 212. The well layer 208 has a thickness of 7 nm, and has a compression distortion (high distortion) of approximately 2.1% with respect to the substrate 202.

MOCVD is used for the thin-film forming method. $H_2$ is used for a carrier gas, and trimethylgallium (TMG), trimethylindium (TMI) and arsine ($AsH_3$) are used as raw materials for the GaInNAs well layer 208. Dimethylhydrazine (DMHy) is used as a raw material for the nitrogen. Since DMHy dissolves at a low temperatures, it is suited for lower-temperature growth at temperature of 600° C. or lower, and is particularly suited for growing the well layer of the multi-quantum well active region having a large distortion that requires the low-temperature growth. In a case where the distortion of the well layer of the multi-quantum well active region in the GaInNAs VCSEL is large, it is preferable to use the low-temperature growth that becomes unbalanced. In this embodiment, the GaInNAs well layer 208 is grown at 540° C.

A mesa 222 is formed by wet etching or a dry etching such as RIE, RIBE and ICP, in a state where at least the side surface of the p-AlAs selectively oxidizing layer 218 is exposed. The mesa 222, when viewed from the top towards the bottom in FIG. 13 has a square shape. Thereafter, the oxidation apparatus 10 described above is used to form an AlxOy current constricting part by oxidizing the AlAs selectively oxidizing layer 218 from exposed side surface by use of water vapor. In this state, the wafer (sample) is placed on the sample table (substrate holder), the base is moved to the oxidizing position, and predetermined water vapor is supplied. Since the monitoring window is separated from the wafer, the oxidation is made uniformly. The wafer is then raised to a predetermined oxidation temperature of approximately 400° C., and the primary oxidation is started. The oxidation is interrupted before reaching an anticipated time when the desired amount of oxidation will be reached. Thereafter, the heating table having the wafer placed thereon is moved to the monitoring position that is close to the monitoring window, and the oxidizing distance, oxidizing area, the vertical horizontal lengths of the non-oxidized region, and the area of the non-oxidized region are monitored by the microscope. Based on the information obtained by the monitoring of the microscope, the oxidation speed of the primary oxidation and the oxidizing distance required for the secondary oxidation (additional oxidation) are calculated, and the additional oxidation time is obtained. The wafer is returned to the oxidizing position, and the secondary oxidation (additional oxidation) is carried out. When the oxidation time of the secondary oxidation elapses, the supply of water vapor is stopped and low-temperature nitrogen is sprayed or blasted onto the wafer, and the oxidation is ended by stopping the heater.

By the oxidation process described above, it was confirmed by the present inventors that the area of the current injecting part can be controlled with a high accuracy in a state where the surface uniformity of the oxidation rate on the wafer is satisfactorily maintained. The oxidation may be interrupted or ended by stopping the supply of water vapor, but it is preferable to lower the substrate temperature (sample temperature) in order to more positively interrupt or end the oxidation. In addition, although the oxidation process is divided into 2 stages in the embodiment and modifications described above, it is of course possible to divide the oxidation process into 3 or more stages.

After the oxidation process ends, the mesa 222 is protected by an insulator layer 224 made of $SiO_2$ or the like, and thereafter, the etched portion is filled with polyimide 226 and planarized. Then, the p-contact layer 220 and the polyimide 226 and the insulator layer 224 existing above the upper mirror layer where the light emitting portion is provided are eliminated, so as to form a p-electrode 228 on the p-contact layer 220 at a portion other than the light emitting portion. In addition, an n-electrode 230 is formed on the back surface of the substrate 202.

The present inventors have confirmed the following with respect to the VCSEL that is made in the above described manner. The oscillation wavelength of the VCSEL was approximately 1.3 µm. In addition, since the current constricting part was formed by selective oxidation of the selectively oxidizing layer having Al and As as the main components, a low threshold current was obtained. According to the current constricting structure using the current constricting part that is made of the Al oxide layer obtained by selective oxidation of the selectively oxidizing layer, the spreading of the current was suppressed by forming the current constricting part close to the active region, and it was possible to efficiently trap the carrier in a small region that is not exposed to the atmosphere. In addition, since the Al oxide layer was formed by oxidation, the index of refraction became small, and it was possible to efficiently trap the light in the small region in which the carrier is trapped by the convex lens effect, to thereby enable lowering of the threshold current. Moreover, since the current constricting structure can be formed with ease, the production cost of the VCSEL was reduced. Furthermore, since the oxidation progresses at the position separated from the monitoring window, it was possible to evaluate the oxidation rate by temporarily stopping the oxidation and to additionally carry out the oxidation depending on the evaluation result, the current injecting part was uniformly formed to the target size for each mesa, to thereby improve the yield.

The monitoring of the oxidized region was made by receiving the reflected light of the light emitted from a light source such as a tungsten lamp to a CCD camera or a vidicon camera via the microscope, and displaying an enlarged image of the mesa on the display part such as a television monitor. On the displayed image of the mesa, the boundary between the oxidized region and the non-oxidized region was clearly recognizable due to the difference in the reflectivities.

Figure 14:
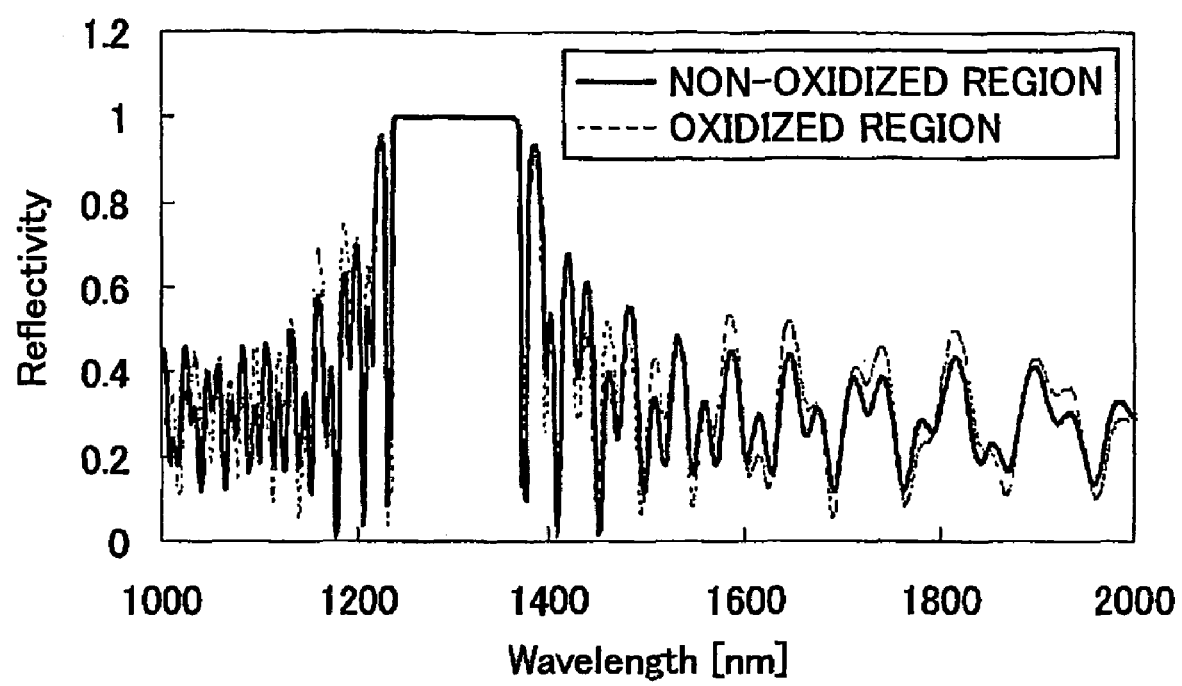
FIG. 14 is a diagram showing a wavelength dependency of reflectivities of the oxidized region and the non-oxidized region of the VCSEL produced by the first embodiment.

FIG. 14 is a diagram a wavelength dependency of reflectivities of the oxidized region and the non-oxidized region of the VCSEL of the first embodiment. In FIG. 14, the reflectivity of the oxidized region is indicated by a dotted line, and the reflectivity of the non-oxidized region is indicated by a solid line. As may be seen from FIG. 14, there is not much difference between the reflectivities of the oxidized region and the non-oxidized region in a high reflection band in a vicinity of the wavelength of 1.3 µm. However, the reflectivities of the oxidized region and the non-oxidized region in bands on both sides of the high reflection band are clearly different. As the wavelengths to be monitored, the short wavelength side of the high reflection band is not preferable since the light absorption due to the DBR mirror material occurs, but the light absorption problem does not occur on the long wavelength side of the high reflection band, and the reflectivity of the oxidized region is high. Accordingly, it is preferable to use a camera having a good sensitivity in the wavelengths on the long wavelength side of the high reflection band. Of various image pickup devices that are presently available, a CCD camera having good sensitivity in the near infrared region may be used to monitor the VCSEL that has the short oscillation wavelength. If the oscillation wavelength of the VCSEL is 1.3 µm as in this embodiment, an infrared vidicon camera having good sensitivity in the long wavelength side of the high reflection band may be used for the monitoring. In addition, the so-called cofocal laser microscope which makes the san by use of infrared laser light and receives the scanned result by a camera is preferable from the point of view that the resolution can be set extremely high, and the laser wavelength may be appropriately selected for use.

Second Embodiment

Figure 15:
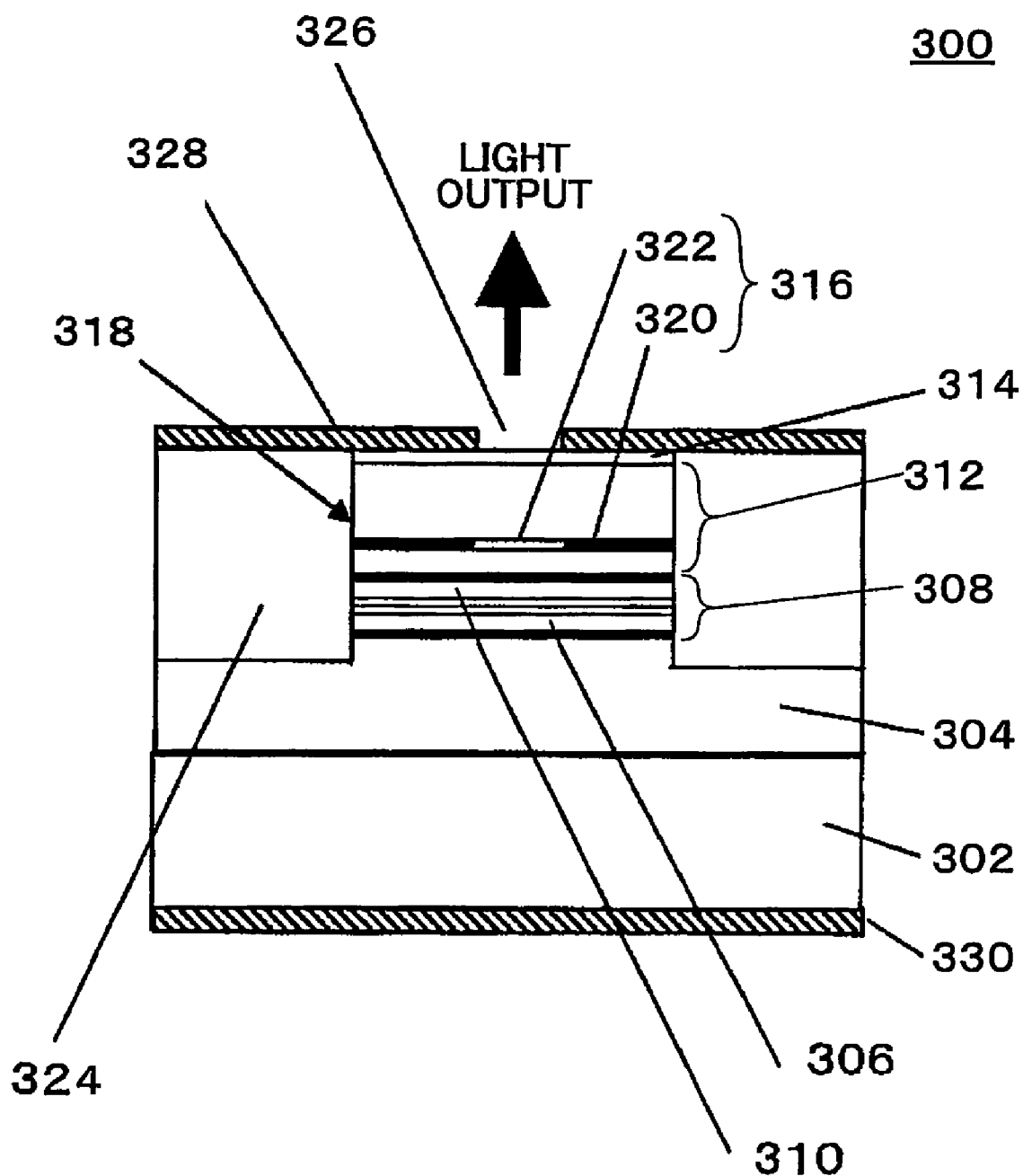
FIG. 15 is a cross sectional view showing a structure of a VCSEL produced by a second embodiment.

FIG. 15 is a cross sectional view showing a structure of a VCSEL produced by a second embodiment of the present invention. A VCSEL 300 shown in FIG. 15 outputs a laser oscillation having a wavelength of 780 nm, and has an n-(100) GaAs substrate 302 having an inclination angle of 2° in a direction of the <100> face orientation. An n-$Al_{0.9}Ga_{0.1}As$ layer and an n-$Al_{0.3}Ga_{0.7}As$ layer are alternately stacked for 35.5 periods on the substrate 302, to form a periodic structure having a thickness that is ¼ the oscillation wavelength within the medium and forming an n-semiconductor distributed Bragg reflection mirror (hereinafter referred to as a first reflection mirror or simply n-DBR mirror) 304. Between two mutually adjacent n-$Al_{0.9}Ga_{0.1}As$ and n-$Al_{0.3}Ga_{0.7}As$ layers, there is inserted a composition inclined layer (not shown) having a thickness of 20 nm and in which the Al composition gradually changes from the Al composition of the n-$Al_{0.9}Ga_{0.1}As$ layer to the Al composition of the n-$Al_{0.3}Ga_{0.7}As$ layer. The composition inclined layer is also sometimes referred to as a composition modulated layer or a composition gradation layer. The thickness of the periodic structure, including the composition inclined layers, is set to ¼ the oscillation wavelength within the medium. Due to this structure, when a current is applied to the n-DBR mirror 304, it is possible to smoothen the band discontinuity between the n-$Al_{0.9}Ga_{0.1}As$ layer and the n-$Al_{0.3}Ga_{0.7}As$ layer and suppress the resistance from becoming high. A quantum well active region 308, including an $Al_{0.5}Ga_{0.5}As$ lower spacer (cladding) layer 306 and an $Al_{0.5}Ga_{0.5}As$ upper spacer (cladding) layer 310, is formed on the n-DBR mirror 304. The quantum well active region 308 which makes the wavelength 780 nm further includes AlGaAs well layers and $Al_{0.3}Ga_{0.7}As$ barrier layers that are alternately stacked between the upper and lower spacer layers 310 and 306, and there are 3 AlGaAs well layers and 2 $Al_{0.3}Ga_{0.7}As$ barrier layers. On the spacer layer 310, p-$Al_xGa_{1-x}As$ (x=0.9) and p-$Al_xGa_{1-x}As$ (x=0.3) layers are alternately stacked for 25 periods, for example, to form a periodic structure that forming an n-semiconductor distributed Bragg reflection mirror (hereinafter referred to as a second reflection mirror or simply p-DBR mirror) 312. Between two mutually adjacent p-$Al_xGa_{1-x}As$ (x=0.9) and p-$Al_xGa_{1-x}As$ (x=0.3) layers, there is inserted a composition inclined layer (not shown), similarly to the n-DBR mirror 304. A p-GaAs contact layer 314 is formed on the top for making contact with the electrode. Between the n-DBR mirror 304 and the p-DBR mirror 312, the length amounts to 1 oscillation wavelength (that is, the so-called random cavity is employed).

MOCVD is used for the thin-film forming (or crystal growing) method. $H_2$ is used for a carrier gas, and trimethylgallium (TMG), trimethylaluminum (TMA) and arsine ($AsH_3$) are used as raw materials for the AlGaAs well layer. $H_2Se$ is used as an n-type dopant, and $CBr_4$ is used as a p-type dopant. The MOCVD can easily form the layers such as the composition inclined layer, by controlling the amount of raw material gas that is supplied. Hence, the MOCVD is more suitable for producing the VCSEL including the DBR mirror when compared to the MBE. In addition, the MOCVD is suited for mass production since it does not require a high vacuum as in the case of the MBE, and it is sufficient to control the flow rate and the supplying time of the raw material that is supplied.

An AlAs selectively oxidizing layer 316 is formed at a portion of the p-DBR mirror 312 having a low index of refraction and close to the quantum well active region 308. A mesa 318 having a predetermined size is formed in a state where the side surface of the p-AlAs selectively oxidizing layer 316 is exposed. Similarly as described above, the p-AlAs selectively oxidizing layer 316 having the exposed side surface is oxidized from the periphery, and an AlxOy current constricting part 320 and a current injecting part 322 surrounded thereby are formed. Next, the etched portion is filled with polyimide 324 and planarized. Then, the p-contact layer 314 and the polyimide 324 existing above the p-DBR mirror 312 where a light emitting portion 326 is provided are eliminated, so as to form a p-electrode 328 on the p-contact layer 314 at a portion other than the light emitting portion 326. In addition, an n-electrode 330 is formed on the back surface of the substrate 302 to thereby form the VCSEL having the oscillation wavelength of 780 nm.

In this embodiment, an AlAs layer is used as the selectively oxidizing layer, but the selectively oxidizing layer may include other elements such as Ga. In addition, the content of the selectively oxidizing layer may be set larger than that of an AlGaAs layer forming the DBR mirror, so as to make the oxidation rate of the DBR mirror faster than that of the selectively oxidizing layer. In addition, the material used for the quantum well active region may be changed, and a semiconductor layer including Al and As may be selectively oxidized to form the current constricting structure of the VCSEL. Furthermore, the present invention is not limited to the VCSEL, and is similarly applicable to other types of lasers such as the edge-emitting laser. In other words, the present invention is similarly applicable to the production of semiconductor elements having a structure such that the current constricting structure is formed by selectively oxidizing a semiconductor layer including Al and As.

[First Application]

Figure 16:
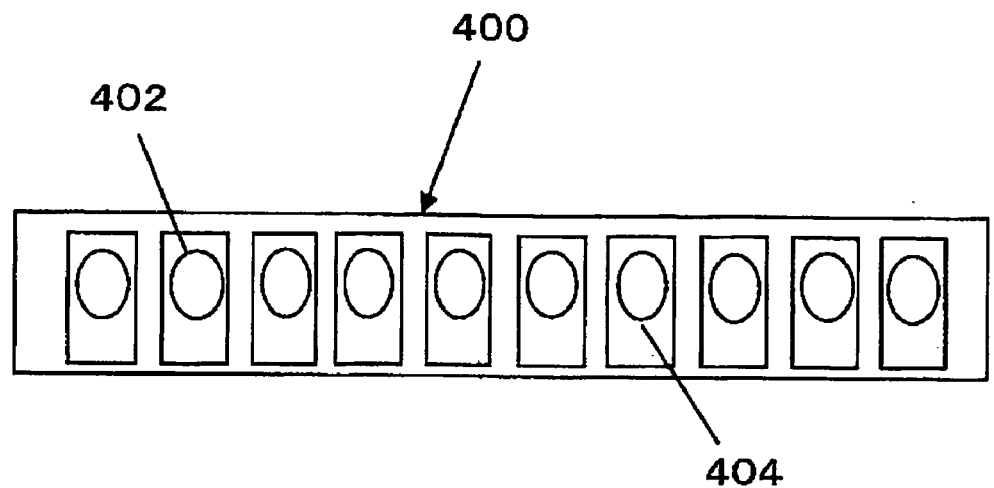
FIG. 16 is a plan view showing a VCSEL array chip using the VCSEL.

FIG. 16 is a plan view showing a VCSEL array chip using the VCSEL. In FIG. 16, a VCSEL array chip 400 has VCSELs 402 arranged in a line. Each VCSEL 402 is produced by any of the embodiments and modifications described above. The internal diameter of the current injecting part surrounded by the current constricting part is 5 μm, and the VCSEL 402 carries out the single mode operation in the lateral mode. In this first application, the VCSEL 402 is formed on a p-type Gas semiconductor substrate, and an n-individual electrode 404 is provided on top while a p-common electrode (not shown) is provided on the bottom. Although the VCSELs 402 are arranged one-dimensionally in FIG. 16, the VCSELs 402 may of course be arranged two-dimensionally.

According to the VCSEL array chip 400 having the VCSELs 402, the arrangement of the VCSELs 402 is simple because the VCSELs 402 are surface-emitting types. In addition, the VCSELs 402 may be formed integrally by a normal semiconductor process, and the VCSELs 402 may be arranged with an extremely high accuracy. For this reason, the yield of the VCSEL array chip 400 is greatly improved, and the production time can be greatly reduced, to thereby enable inexpensive VCSEL array chips 400 to be produced.

[Second Application]

Figure 17:
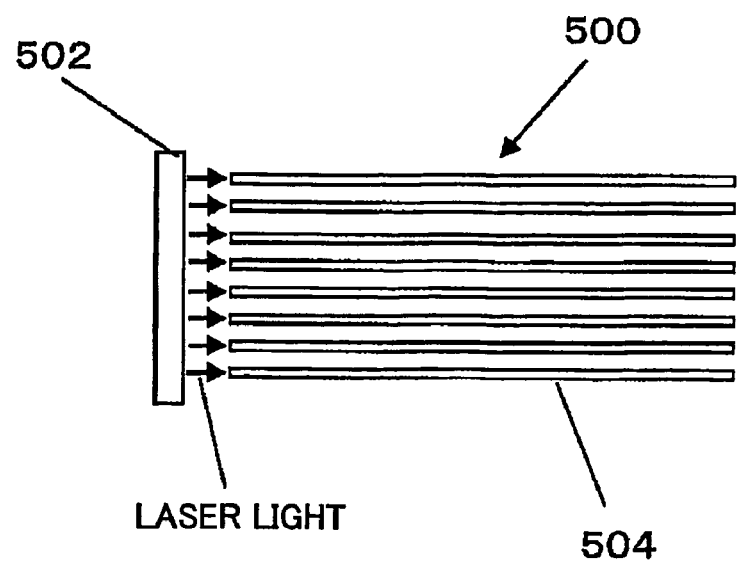
FIG. 17 is a diagram showing an optical transmission module using the VCSEL.

FIG. 17 is a diagram showing an optical transmission module using the VCSEL. An optical transmission module 500 shown in FIG. 17 uses VCSELs. More particularly, the optical transmission module 500 includes the VCSEL array chip 502 shown in FIG. 16, and a plurality of optical waveguides 504. Each optical waveguide 504 confronts the end surface (light output part) of a corresponding VCSEL 402, so that the light emitted from this corresponding VCSEL 402 is input to the optical waveguide 504. The optical waveguide 504 may be formed by an optical fiber, for example. The optical fiber may be made of silica fiber, for example. In this particular application, a single mode element which emits light having a wavelength of 1.3 μm is used as the VCSEL 402, and a single mode fiber is used for the optical fiber forming the optical waveguide 504.

According to the optical transmission module 500 having the structure described above, a high-speed parallel transmission is possible because the VCSELs 402 are used as the light emitting means (or light generating means), and a large amount of data can be transmitted simultaneously. In addition, since the current injecting part and the current constricting part of each of the VCSELs 402 are formed to have uniform sizes, it is easy to set a driving current of a driving circuit in the optical transmission module 500. Moreover, it is possible to realize inexpensive optical transmission modules 500 and optical communication systems having a high reliability.

Although the VCSEL and the optical fiber (VCSEL 402 and optical waveguide 504) correspond 1:1 in the optical transmission module 500 shown in FIG. 17, a plurality of VCSELs having different oscillation wavelengths may be arranged one-dimensionally or two-dimensionally, and a wavelength multiplexed transmission may be made, to further increase the transmission speed. By using a GaAs quantum well layer for the active region of the VCSEL to make the oscillation wavelength of the VCSEL 850 nm, it becomes possible to combine the VCSELs with multi-mode fibers.

[Third Application]

Figure 18:
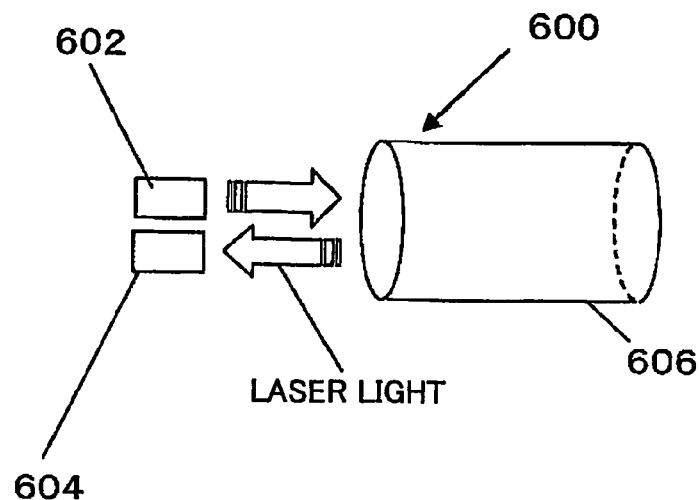
FIG. 18 is a diagram showing an optical communication module using the VCSEL.

FIG. 18 is a diagram showing an optical communication module using the VCSEL. As shown in FIG. 18, an optical communication (transmission and reception) module 600 includes a VCSEL 602 that is produced by the second embodiment described above, a photodiode 604 for reception, and an acrylic plastic fiber 606. A multi-mode element with an oscillation wavelength of 780 nm is used for the VCSEL 602.

According to the optical communication module 600 having the structure described above, it is possible to realize an inexpensive optical communication system because the VCSEL 602 can be produced at a low cost as described above, and the plastic fiber 606 is inexpensive. In addition, since the fiber diameter of the plastic fiber 606 is relatively large, the coupling of the plastic fiber 606 with other fibers is facilitated, to thereby facilitate the forming of the optical communication system. Hence, the optical communication module 600 is suited for an in-house communication system for home use or office use, and also for communication systems within relatively small equipments.

In the optical transmission using the acrylic plastic fiber, there are studies to use the VCSEL having the oscillation wavelength of 650 nm by taking into consideration the absorption loss of the acrylic plastic fiber, but it has not been reduced to practice due to the poor high-temperature characteristics of the acrylic plastic fiber. Accordingly, the light emitting diode is presently used as the light emitting source. However, the light emitting diode is not suited for high-speed modulation, and in order to realize a high-speed transmission exceeding 1 Gbps, it is essential to develop a new semiconductor laser. But according to the VCSEL having the oscillation wavelength of 780 nm produced according to the present invention, the active region gain is large, a high output is obtainable and good high-temperature characteristics are obtainable compared to the VCSEL having the oscillation wavelength of 650 nm. For this reason, the VCSEL produced according to the present invention generates less heat compared to the VCSEL having the oscillation wavelength of 650 nm, and an inexpensive system can be realized in that no cooling is required for the VCSEL.

In addition, the optical communication system using the optical communication module 600 described above may not only be used for the communication between equipments such as computers in LANs or the like using optical fibers, but also used for short-distance communication, as an optical interconnection for data transmission between boards of equipments, between LSIs of the board, and between elements within the LSI.

Recently, the processing capabilities of LSIs and the like have improved considerably, and there are demands to improve the communication speed at the portions where such LSIs and the like are connected. By using the optical communication module 600, however, it is possible to realize an ultra-high-speed computer system by changing the conventional electrical connections of the signals within the system to optical interconnections at portions such as between the boards of the computer system, between the LSIs of the board, and between the elements within the LSI.

Moreover, a plurality of computer systems and the like may be connected by the optical transmission module 500 or the optical communication module 600 described above, so as to build an ultra-high-speed network system. Since the VCSEL has a considerably low power consumption compared to the edge-emitting semiconductor laser and the VCSEL can easily be arranged two-dimensionally, it is suited for use in a parallel transmission type optical communication system.

[Fourth Application]

Figure 19:
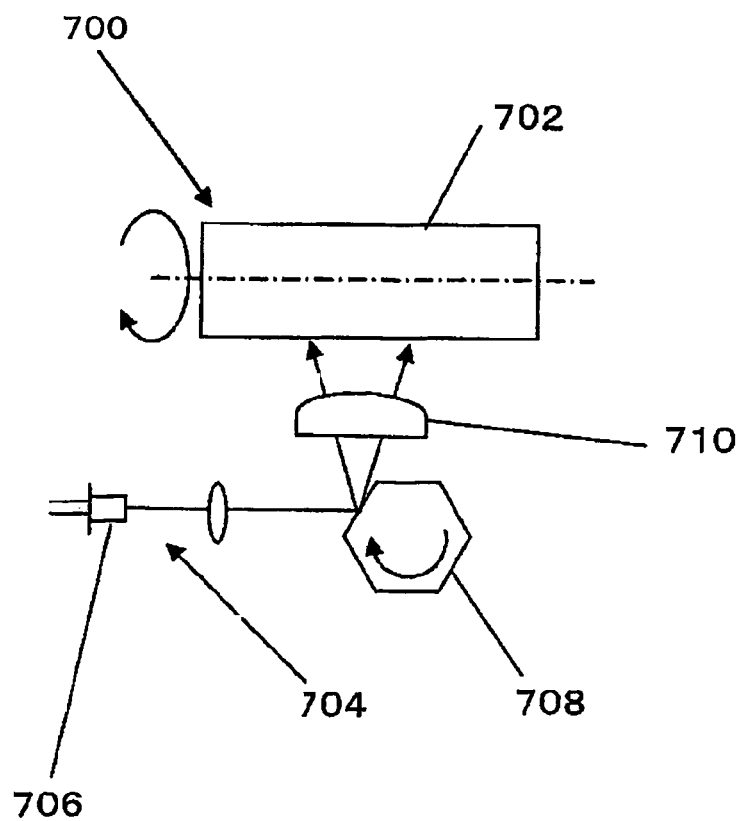
FIG. 19 is a diagram showing a general structure of an image forming apparatus using the VCSEL.

FIG. 19 is a diagram showing a general structure of an image forming apparatus using the VCSEL. For example, an image forming apparatus 700 shown in FIG. 19 is the so-called composite apparatus or multi-function peripheral (MFP) integrally having the functions of an electrophotography type copying apparatus, a printing apparatus, a facsimile apparatus and the like. The image forming apparatus 700 includes a photoconductive body 702 that forms an electrostatic image bearing body, and an exposure system 704 that exposes by light a uniformly charged outer peripheral' surface of the photoconductive body 702. The exposure system 704 includes a light source 706 for outputting light corresponding to the image that is to be formed, a polygonal mirror 708 for scanning the photoconductive body 702 by reflecting the light output from the light source 706, and a lens system 710 for imaging the light reflected by the polygonal mirror 708 on the photoconductive body 702. A VCSEL array 712 is used for the light source 706.

Figure 20:
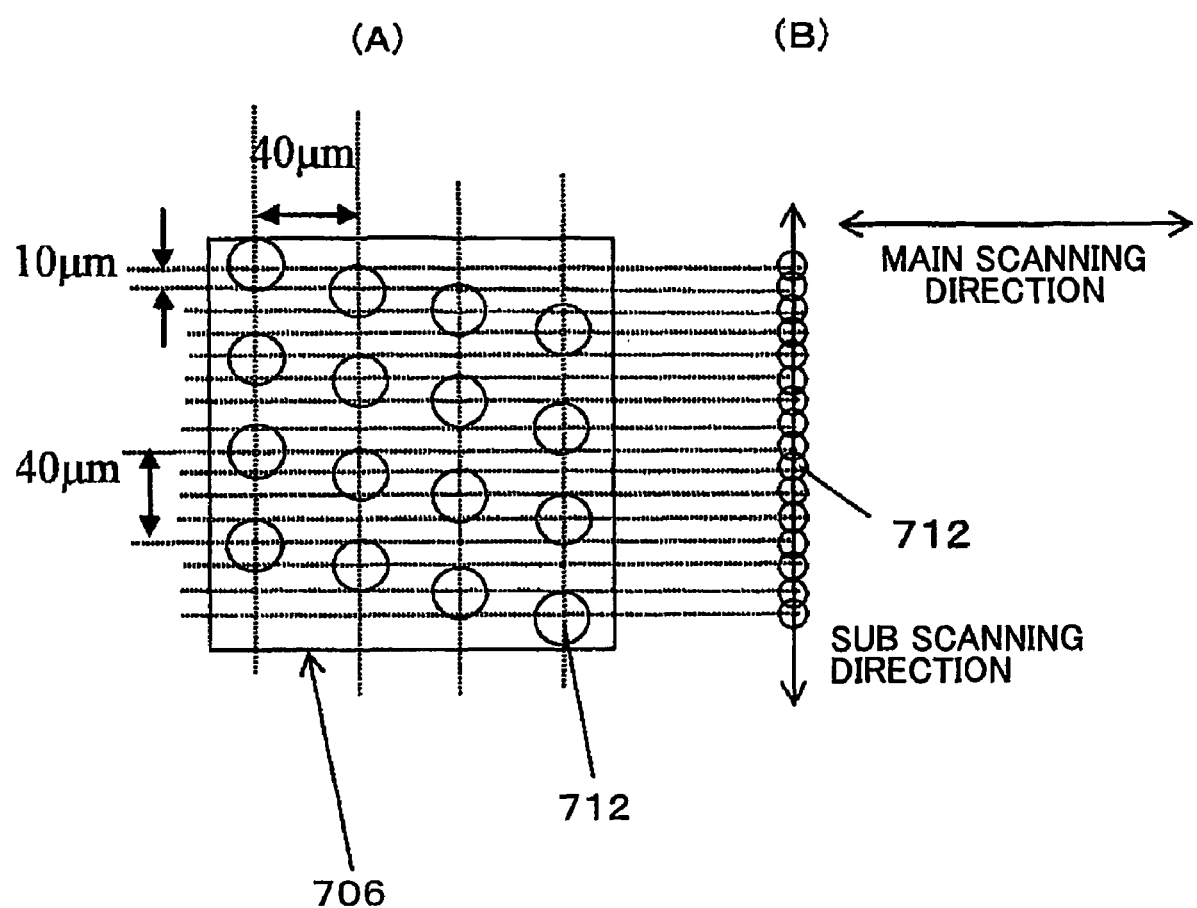
FIG. 20 is a plan view on an enlarged scale showing a light source for exposure in the image forming apparatus shown in FIG. 19.

FIG. 20 is a plan view on an enlarged scale showing the light source 706 for exposure in the image forming apparatus 700 shown in FIG. 19. As shown in FIG. 20(A), the VCSEL array 706 has VCSELs 712 that have the oscillation wavelength of 780 nm arranged two-dimensionally. More particularly, 16 VCSELs 712 are arranged in a 4×4 arrangement, with 4 VCSELs 712 arranged at a predetermined pitch (40 µm) in a horizontal direction in FIG. 20(A) (main scanning direction or an axial direction of the photoconductive body 702) and 4 VCSELs 712 arranged at a predetermined pitch (40 µm) in a vertical direction (sub scanning direction or a rotating direction of the photoconductive body 702). Between two mutually adjacent columns extending in the vertical direction, the positions of the VCSELs 712 in one column is shifted by 10 µm in the vertical direction with respect to the corresponding VCSELs 712 in the adjacent column. Accordingly, as shown in FIG. 20(B), 16 spots 714 are formed on the photoconductive body 702 at intervals of essentially 10 µm in the sub scanning direction.

According to the image forming apparatus 700 having the structure described above, it is possible to simultaneously irradiate the plurality of laser beams emitted from the plurality of two-dimensionally arranged VCSELs 712 on the photoconductive body 702. Hence, compared to an image forming apparatus using a single laser oscillation light source, it is possible to form the image at an extremely high speed. In addition, since the VCSELs 712 are suited for two-dimensional integration, it is possible to more easily increase the number of laser beams compared to the conventional edge-emitting semiconductor laser array. In the particular case described above, the dots can be formed at intervals of approximately 10 µm in the sub scanning direction, which corresponds to 2400 dpi. Moreover, the write intervals in the main scanning direction can easily be controlled by adjusting the light emission timings of the VCSELs 712. Furthermore, since 16 dots can be written simultaneously using the VCSEL array 706 described above, an extremely high printing speed can be achieved. Of course, the number of VCSELs 712 that are arranged in the vertical direction and the horizontal direction may be increased to further increase the printing speed. By adjusting the intervals or pitch of the VCSELs 712, the intervals of the spots 712 in the sub scanning direction can be adjusted, and it is possible to realize a high-definition printing at a high density of 400 dpi or higher. Since the current injecting parts of the VCSELs 712 that are produced according to the present invention are uniformly formed, it is possible to positively form spots 712 having the target diameter.

[Other Applications]

In the fourth application described above, the VCSELs 712 are used for the light source 706 for image writing. However, the VCSEL 712 may also be used for a light source for recording and/or reproducing information with respect to recording media such as CDs. Since the VCSELs 712 produced according to the present invention are inexpensive and have smaller power consumption compared to edge-emitting semiconductor lasers, the VCSELs 712 are particularly suited for use in portable optical pickup apparatuses which have strict power consumption requirements.

This application claims the benefit of a Japanese Patent Application No. 2005-037805 filed Feb. 15, 2005, in the Japanese Patent Office, the disclosure of which is hereby incorporated by reference.

Further, the present invention is not limited to these embodiments, but various variations and modifications may be made without departing from the scope of the present invention.

The invention claimed is:

1. A method for producing a semiconductor element, comprising:
   placing within a water vapor atmosphere a semiconductor sample that includes a mesa having a semiconductor layer including Al and As;
   forming a current constricting part and a current injecting part that is surrounded by the current constricting part in the semiconductor layer by oxidizing the semiconductor layer from a peripheral end of the semiconductor layer appearing at an outer peripheral side surface of the mesa towards an inner radial direction so as to leave a central portion of the semiconductor layer non-oxidized;
   interrupting an oxidation process at least once during oxidation of the semiconductor layer; and
   monitoring an oxidation rate of the semiconductor layer while the oxidation process is interrupted; and
   exhausting an atmosphere gas within the oxidation chamber by vacuum while the oxidation process is interrupted,
   wherein said monitoring includes:
      moving the semiconductor sample within an oxidation chamber to a position where the mesa is adjacent to a monitoring part provided outside the oxidation chamber via a monitoring window of the oxidation chamber while the oxidation process is interrupted; and
      obtaining the oxidation rate based on a size of the current constricting part or the current injecting part that is monitored by the monitoring part.

2. The method as claimed in claim 1, further comprising:
   obtaining an amount of additional oxidation that is to be made based on the oxidation rate; and
   additionally oxidizing the semiconductor layer by the amount of additional oxidation.

3. A method for producing a semiconductor element, comprising:
   placing within a water vapor atmosphere a semiconductor sample that includes a mesa having a semiconductor layer including Al and As;
   forming a current constricting part and a current injecting part that is surrounded by the current constricting part in the semiconductor layer by oxidizing the semiconductor layer from a peripheral end of the semiconductor layer appearing at an outer peripheral side surface of the mesa towards an inner radial direction so as to leave a central portion of the semiconductor layer non-oxidized;
   interrupting an oxidation process at least once during oxidation of the semiconductor layer;
   monitoring an oxidation rate of the semiconductor layer while the oxidation process is interrupted; and
   spraying or blasting an inert gas onto the semiconductor sample within the oxidation chamber while the oxidation process is interrupted,
   wherein said monitoring includes:
      moving the semiconductor sample within an oxidation chamber to a position where the mesa is adjacent to a monitoring part provided outside the oxidation chamber via a monitoring window of the oxidation chamber while the oxidation process is interrupted; and
      obtaining the oxidation rate based on a size of the current constricting part or the current injecting part that is monitored by the monitoring part.

4. The method as claimed in claim 1, further comprising:
   utilizing the semiconductor element to form a vertical-cavity surface-emitting laser (VCSEL).

5. A method for producing a semiconductor element, comprising:
   placing within a water vapor atmosphere a semiconductor sample that includes a mesa having a semiconductor layer including Al and As;
   forming a current constricting part and a current injecting part that is surrounded by the current constricting part in the semiconductor layer by oxidizing the semiconductor layer from a peripheral end of the semiconductor layer appearing at an outer peripheral side surface of the mesa towards an inner radial direction so as to leave a central portion of the semiconductor layer non-oxidized;
   interrupting an oxidation process at least once during oxidation of the semiconductor layer;
   monitoring an oxidation rate of the semiconductor layer while the oxidation process is interrupted; and
   supplying an inert gas at a low temperature onto the semiconductor sample while the semiconductor sample is within an oxidation chamber while the oxidation process is interrupted, to replace the water vapor atmosphere within the oxidation chamber with the inert gas and to cool the semiconductor sample.

6. The method as claimed in claim 1, wherein the oxidation process is interrupted at a predetermined timing prior to the oxidation reaching a predetermined final oxidized state.

7. The method as claimed in claim 6, further comprising:
   determining said predetermined timing by subtracting a predetermined amount from a total required oxidation time.

* * * * *